(12) United States Patent
Inoue

(10) Patent No.: US 10,996,696 B2
(45) Date of Patent: May 4, 2021

(54) POWER SUPPLY CIRCUIT, POWER SUPPLY DEVICE, AND VEHICLE

(71) Applicant: Rohm Co., Ltd., Kyoto (JP)

(72) Inventor: Hiroki Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/840,816

(22) Filed: Apr. 6, 2020

(65) Prior Publication Data

US 2020/0326737 A1 Oct. 15, 2020

(30) Foreign Application Priority Data

Apr. 12, 2019 (JP) .............................. JP2019-076251

(51) Int. Cl.
| | |
|---|---|
| *H03K 19/003* | (2006.01) |
| *H03K 17/22* | (2006.01) |
| *H03K 17/082* | (2006.01) |
| *G05F 1/46* | (2006.01) |
| *G05F 3/24* | (2006.01) |

(52) U.S. Cl.
CPC .............. *G05F 1/465* (2013.01); *G05F 3/242* (2013.01); *H03K 17/0822* (2013.01); *H03K 17/223* (2013.01); *H03K 19/00315* (2013.01)

(58) Field of Classification Search
CPC ..... G05F 1/465; G05F 3/242; H03K 17/0822; H03K 17/223; H03K 19/00315
See application file for complete search history.

(56) References Cited

U.S. PATENT DOCUMENTS

2016/0291618 A1* 10/2016 Wismar .................. G05F 1/575

FOREIGN PATENT DOCUMENTS

JP 2004-362250 12/2004

* cited by examiner

*Primary Examiner* — John W Poos
(74) *Attorney, Agent, or Firm* — Fish & Richardson P.C.

(57) ABSTRACT

A power supply circuit that outputs via an output terminal an output voltage based on an input voltage applied to an input terminal includes: an inserted transistor of an N-channel depletion type inserted between the input terminal and an internal supply power terminal; and a regulator configured to generate the output voltage by using as a supply voltage a voltage applied to the internal supply power terminal. The gate of the inserted transistor is connected to the output terminal.

12 Claims, 11 Drawing Sheets

POWER SUPPLY CIRCUIT, POWER SUPPLY DEVICE, AND VEHICLE

This nonprovisional application claims priority under 35 U.S.C. § 119(a) on Patent Application No. 2019-076251 filed in Japan on Apr. 12, 2019, the entire contents of which are hereby incorporated by reference.

BACKGROUND OF THE INVENTION

1. Field of the Invention

The present invention relates to a power supply circuit, a power supply device, and a vehicle.

2. Description of Related Art

Power supply circuits, that is, circuits that generate a desired output voltage from an input voltage (see, for example, Patent Document 1 identified below), are incorporated in a variety of appliances.

Patent Document 1: Japanese Patent Application published as No. 2004-362250

Ripple suppression performance (supply voltage variation suppression ratio) is one of the important properties of power supply circuits. A technology that provides high ripple suppression performance is promising. Here, it is preferable that high ripple suppression performance be achieved with a simple configuration.

SUMMARY OF THE INVENTION

An object of the present invention is to provide a power supply circuit and a power supply device that contribute to higher ripple suppression performance, and to provide a vehicle that incorporates such a power supply circuit and a power supply device.

According to one aspect of the present invention, a power supply circuit that outputs via an output terminal an output voltage based on an input voltage applied to an input terminal includes: an inserted transistor of an N-channel depletion type inserted between the input terminal and an internal supply power terminal; and a regulator configured to generate the output voltage by using as a supply voltage a voltage applied to the internal supply power terminal. The gate of the inserted transistor is connected to the output terminal. (A first configuration.)

In the power supply circuit of the first configuration described above, the drain and the source of the inserted transistor can be connected to the input terminal and the internal supply power terminal respectively, and the output terminal can be pulled down. (A second configuration.)

In the power supply circuit of the first or second configuration described above, the regulator can include: an output transistor provided between the internal supply power terminal or the input terminal and the output terminal; and a controller configured to control the gate of the output transistor in accordance with the output voltage. (A third configuration.)

According to another aspect of the present invention, a power supply circuit that outputs via an output terminal an output voltage based on an input voltage applied to an input terminal includes: an inserted transistor of an N-channel type inserted between the input terminal and an internal supply power terminal a regulator configured to generate the output voltage by using as a supply voltage a voltage applied to the internal supply power terminal; and a gate voltage generator connected to the output terminal and configured to feed a gate voltage commensurate with the output voltage to the gate of the inserted transistor. (A fourth configuration.)

In the power supply circuit of the fourth configuration described above, the drain and the source of the inserted transistor can be connected to the input terminal and the internal supply power terminal respectively, and the output terminal can be pulled down. (A fifth configuration.)

In the power supply circuit of the fourth or fifth configuration described above, the regulator can include: an output transistor provided between the internal supply power terminal or the input terminal and the output terminal; and a controller configured to control the gate of the output transistor in accordance with the output voltage. (A sixth configuration.)

In the power supply circuit of any of the fourth to sixth configurations described above, the gate voltage generator can be configured to generate the gate voltage of the inserted transistor by shifting the level of the output voltage. (A seventh configuration.)

In the power supply circuit of any of the fourth to seventh configurations described above, the gate voltage generator can be configured, when the output voltage has a ground potential to feed a positive voltage based on the input voltage to the gate of the inserted transistor. (An eighth configuration.)

In the power supply circuit of any of the fourth to eighth configurations described above, the inserted transistor can be a transistor of an N-channel depletion type. (A ninth configuration.)

In the power supply circuit of any of the fourth to eighth configurations described above, the inserted transistor can be a transistor of an N-channel enhancement type. (A tenth configuration.)

According to yet another aspect of the present invention, a power supply device includes the power supply circuit of any of the first to tenth configurations described above as an internal power supply circuit that generates an internal reference voltage or an internal supply voltage. (An eleventh configuration.)

According to still another aspect of the present invention, a vehicle includes: the power supply device of the eleventh configuration described above; and a load that is supplied with electric power from the power supply device. (A twelfth configuration.)

According to the present invention, it is possible to provide a power supply circuit and a power supply device that contribute to higher ripple suppression performance, and to provide a vehicle that incorporates such a power supply circuit and a power supply device.

DETAILED DESCRIPTION OF PREFERRED EMBODIMENTS

Hereinafter, examples embodying the present invention will be described specifically with reference to the accompanying diagrams. Among the diagrams referred to in the course, the same parts are identified by the same reference signs, and in principle no overlapping description of the same parts will be repeated. In the present specification, for the sake of simple description, symbols and other designations referring to information, signals, physical quantities, elements, components, and the like are occasionally used with the names of the corresponding information, signals, physical quantities, elements, components, and the like omitted or abbreviated. For example, an output transistor mentioned later and identified by the reference sign "M1" (see FIG. 5) is at times designated as "output transistor M1" and is at other times abbreviated to "transistor M1", those designations both referring to the same entity.

First, some of the terms used to describe embodiments of the present invention will be defined. In embodiments of the present invention, "IC" is short for "integrated circuit". "Ground" refers to a conducting part having a reference potential of 0 V (zero volts), or to such a reference potential itself. A potential of 0 V is sometimes referred to as a ground potential. In embodiments of the present invention, any voltage mentioned with no particular reference mentioned is a potential relative to a ground. With respect to any MOSFET mentioned in the following description, unless otherwise stated, the backgate is assumed to be connected to the source. "MOSFET" is short for "metal-oxide-semiconductor field-effect transistor". With respect to any transistor configured as a MOSFET, the gate-source voltage denotes the potential at the gate relative to the potential at the source.

REFERENCE EMBODIMENT

Figure 1:
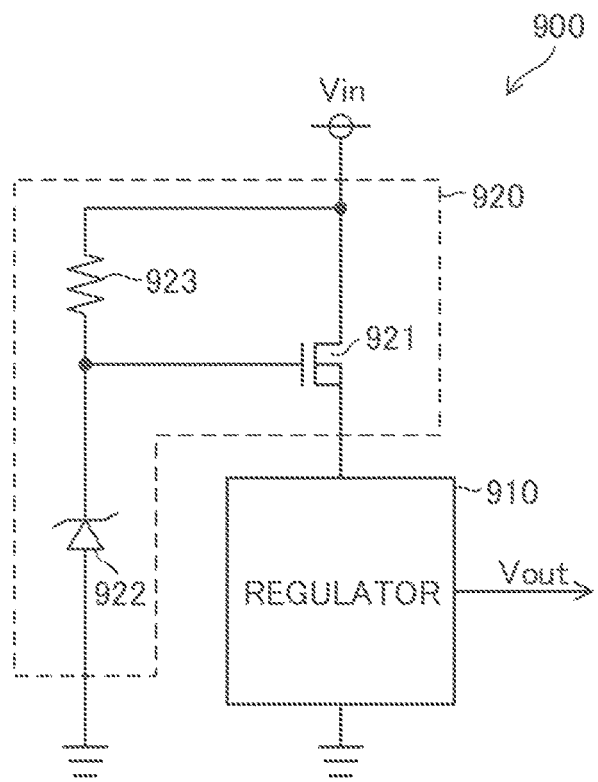
FIG. 1 is a schematic configuration diagram of a power supply circuit according to a reference embodiment.

First, a reference embodiment for comparison with embodiments of the present invention will be described. FIG. 1 shows, in connection with the reference embodiment, the configuration of a power supply circuit 900 which generates an output voltage Vout from an input voltage Vin. The power supply circuit 900 includes a regulator 910, and this regulator 910 is a linear regulator that produces the output voltage Vout by using a supply voltage fed to itself. The power supply circuit 900 includes, in addition to the regulator 910, a clamp circuit 920 composed of a transistor 921, a Zener diode 922, and a resistor 923, and the supply voltage to the regulator 910 is supplied to it via the transistor 921.

The transistor 921 is a MOSFET of an N-channel type. The input voltage Vin to the power supply circuit 900 is applied to the drain of the transistor 921 and to one terminal of the resistor 923, and the gate of the transistor 921 is connected to both the other terminal of the resistor 923 and the cathode of the Zener diode 922. The anode of the Zener diode 922 is connected to a ground. The source voltage of the transistor 921 is taken as the supply voltage to the regulator 910.

In the power supply circuit 900, the Zener voltage of the Zener diode 922 determines the gate voltage of the transistor 921, and the gate voltage of the transistor 921 determines the supply voltage to the regulator 910 (i.e., the source voltage of the transistor 921). Accordingly, for example, in a state where the input voltage Vin is higher than the Zener voltage, even when the input voltage Vin rises, the supply voltage to the regulator 910 is clamped at a voltage based on the characteristics of the clamp circuit 920, and thus a variation in the input voltage Vin does not cause a variation in the supply voltage to the regulator 910 (though, in strict terms, it does cause a slight variation). It is thus possible to achieve high ripple suppression performance (a high supply voltage variation suppression ratio).

Figure 2:
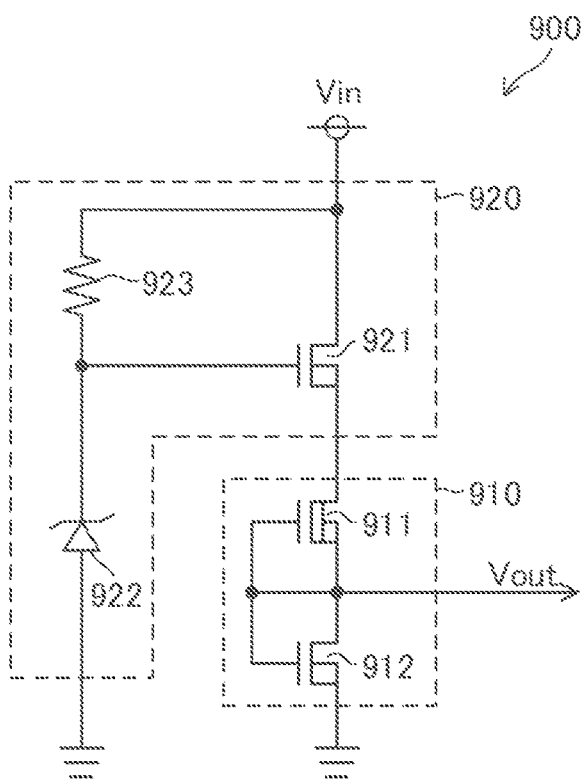
FIG. 2 is a circuit diagram of the power supply circuit according to the reference embodiment.

FIG. 2 shows an example of the configuration of the regulator 910. The regulator 910 in FIG. 2 is composed of a transistor 911, which is a MOSET of an N-channel depletion type, and a transistor 912, which is a MOSFET of an N-channel enhancement type. The drain of the transistor 911 is connected to the source of the transistor 921, and the source of the transistor 912 is connected to the ground. The gate and the source of the transistor 911 and the drain and the gate of the transistor 912 are connected together, and at the connection node at which they are connected together appears the output voltage Vout, which corresponds to the gate-source voltage of the transistor 912.

The regulator 910 in FIG. 2 is composed of low-withstand-voltage elements; accordingly, to give the power supply circuit 900 a high withstand voltage, a high-withstand-voltage transistor 921 can be used. As the regulator 910, a circuit that employs the configuration of a band-gap reference or a circuit that includes an amplifier circuit can be used.

As mentioned above, the configuration of the power supply circuit 900 provides high ripple suppression performance but requires a plurality of elements for clamping (921 to 923). In addition, a current needs to be kept passing through the Zener diode 922 via the resistor 923 all the time, and this results in increased power consumption.

First Embodiment

Figure 3:
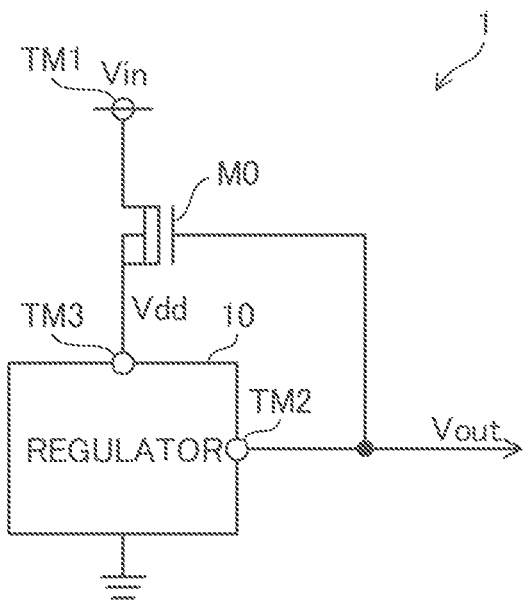
FIG. 3 is a schematic configuration diagram of a power supply circuit according to a first embodiment of the present invention.

A first embodiment of the present invention will be described. FIG. 3 is a schematic configuration diagram of a power supply circuit 1 according to the first embodiment of the present invention. The power supply circuit 1 can be fabricated in the form of a semiconductor integrated circuit. The power supply circuit 1 is a linear power supply circuit that generates the output voltage Vout by bucking (stepping down) the input voltage Vin. Except in a transient state, the input voltage Vin and the output voltage Vout each have a predetermined positive voltage value.

The power supply circuit 1 includes a transistor M0 and a regulator 1), and further includes: an input terminal TM1, to which the input voltage Vin is applied; an output terminal TM2, to which the output voltage Vout is applied; and an internal supply power terminal TM3. A voltage Vdd that is applied to the internal supply power terminal TM3 serves as the supply voltage to the regulator 10.

The transistor M0 is a MOSFET of an N-channel depletion type. Accordingly, the threshold voltage of the transistor M0 has a negative voltage value (e.g., −0.4 V). The transistor M0 is inserted between the input terminal TM1 and the internal supply power terminal TM3. More specifically, the drain of the transistor M0 is connected to the input terminal TM1, and the source of the transistor M0 is connected to the internal supply power terminal TM3.

The regulator 10 is a linear regulator that generates the output voltage Vout by using, as the supply voltage to it, the voltage Vdd applied to the internal supply power terminal TM3. The output voltage Vout generated by the regulator 10 is output via the output terminal TM2.

The gate of the transistor M0 is connected to the output terminal TM2. That is, in the power supply circuit 1, the output voltage Vout is taken as the gate voltage of the transistor M0. Though not shown in FIG. 3 the output terminal TM2 is pulled down.

Figure 4:
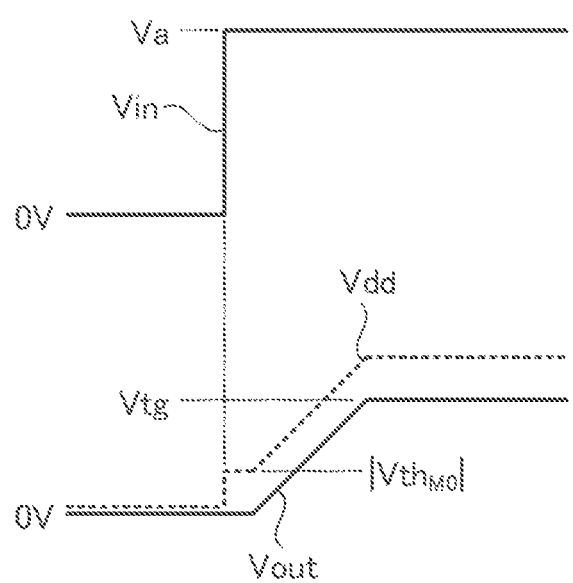
FIG. 4 is a diagram showing, in connection with the first embodiment of the present invention, the waveforms of voltages at relevant points during the start-up of the power supply circuit.

With reference to FIG. 4, the operation of the power supply circuit 1 will be described. FIG. 4 schematically shows the waveforms of voltages at relevant points during and around the start-up of the power supply circuit 1. In FIG. 4, for the sake of convenience of illustration, the waveform of the output voltage Vout indicated by a solid polygonal line and the waveform of the voltage Vdd indicated by a broken polygonal line are shown with a slight vertical displacement from each other. Here, the threshold voltage of the transistor M0, in particular, is represented by the symbol $Vth_{M0}$ and, for the sake of concrete description, the threshold voltage of the transistor M0 is assumed to be −0.4 V.

Suppose that, starting in a state where the input voltage Vin and the output voltage Vout equal 0 V, the input voltage Vin has risen to a sufficiently high voltage Va. The voltage Va is at least higher than the target voltage Vtg (e.g., 3.0 V) at which the output voltage Vout is to be controlled to remain, and can be a voltage such that $Va \geq Vtg + |Vth_{M0}|$, where $|Vth_{M0}|$ represents the absolute value of the threshold voltage of the transistor M0. Since the output terminal TM2 is pulled down as mentioned above, in a state where the output voltage Vout equals 0 V, the gate voltage of the transistor M0 equals 0 V.

As the input voltage Vin rises starting at 0 V, a current passes from the input terminal TM1 to the internal supply power terminal TM3 through the transistor M0, and the voltage Vdd rises. When the input voltage Vin is equal to or higher than 0.4 V, then $Vdd = Vout - Vth_{M0} = Vout + 0.4$. Thus, when the output voltage Vout equals 0 V, the voltage Vdd rises up to the voltage $|Vth_{M0}|$.

Receiving the voltage $|Vth_{M0}|$ as the supply voltage Vdd, the regulator 10 starts up; thus the regulator 10 makes the output voltage Vout rise from 0 V. As the output voltage Vout rises from 0 V, in coordination with the rise in the gate voltage of the transistor M0, also the voltage Vdd rises. When the output voltage Vout reaches the predetermined target voltage Vtg, the output voltage Vout stops rising, and thereafter the output voltage Vout is stabilized at the target voltage Vtg.

In the power supply circuit 1, the transistor M0 forms a source follower circuit; thus, in a state where the input voltage Vin is equal to or higher than a particular voltage, the supply voltage Vdd does not depend on the input voltage Vin and is determined based on the output voltage Vout. Specifically, for example, even when, in a state where the input voltage Vin is equal to or higher than the particular voltage, the input voltage Vin rises from a given voltage, the supply voltage Vdd to the regulator 10 is clamped at a voltage which is the sum of the stabilized output voltage Vout and the voltage $|Vth_{M0}|$, and thus a variation in the input voltage Vin does not cause a variation in the supply voltage Vdd to the regulator 10 (through, in strict terms, it does cause a slight variation). Similar operation results also when the input voltage Vin drops. It is thus possible to achieve high ripple suppression performance (a high supply voltage variation suppression ratio). In this connection, the insertion of the transistor M0 results in better characteristics not only against fine ripples in the input voltage Vin but also against large input variations (i.e., large variations in the input voltage Vin).

The regulator 10, which is a linear regulator, itself exerts ripple suppressing performance within its capability. In the power supply circuit 1, the gate of the transistor M0, which functions as a clamping element, is controlled by use of the output voltage Vout, which is stabilized by the performance of the regulator 10; thus the power supply circuit 1 is expected to offer greatly enhanced ripple suppression performance including the characteristics against large input variations.

Also, simply adding the transistor M0 to the regulator 10, which can be an existing regulator, achieves high ripple suppression performance. That is, as compared with the configuration in FIG. 1, high ripple suppression performance can be achieved with a simple configuration (and hence with less space and at lower cost). Also, as compared with the configuration in FIG. 1, power consumption can be reduced. Specifically, the power consumption by the Zener diode 922 and the resistor 923 in FIG. 1 is eliminated in the configuration in FIG. 3.

Further, with the configuration in FIG. 1, the design of the clamp circuit 920 needs to be changed in accordance with the set value of the output voltage Vout (which corresponds to the target voltage Vtg). That is, a voltage higher than the set value of the output voltage Vout needs to be supplied to the regulator 910, and this requires design changes such as, for example, if the set value of the output voltage Vout is 3 V, setting the Zener voltage of the Zener diode 922 at 5 V and, if the set value of the output voltage Vout is 8 V, setting the Zener voltage of the Zener diode 922 at 10 V. In contrast, with the configuration in FIG. 3, in accordance with the set value of the output voltage Vout (which corresponds to the target voltage Vtg), a supply voltage Vdd that the set value requires is, as it were, automatically supplied through the transistor M0 to the regulator 10. This eliminates design changes as mentioned above, and allows easy adaptation to various specifications.

Also, using a high-withstand-voltage element as the transistor M0 gives the entire power supply circuit 1 a high withstand voltage even with a regulator 10 composed of low-withstand-voltage elements.

A high-withstand-voltage element denotes an element that does not break down under application of a higher voltage as compared with a low-withstand-voltage element. Specifically, for example, applying a voltage higher than a first predetermined voltage to a low-withstand-voltage element will or can result in its breakdown; however, applying a second predetermined voltage higher than the first predetermined voltage to a high-withstand-voltage element will not result in its breakdown. The first and second predetermined voltages correspond to the withstand voltages of a low-withstand-voltage and a high-withstand-voltage element respectively.

The first embodiment includes Practical Examples EX1_1 to EX1_4 presented below. Unless otherwise stated, or unless inconsistent, any feature described above in connection with the first embodiment applies to Practical Examples EX1_1 to EX1_4 presented below; for any feature described in connection with any of the practical examples that contradicts a feature described above in connection with the first embodiment, the description of that feature given in connection with that practical example can prevail. Unless inconsistent, any feature of any of Practical Examples EX1_1 to EX1_4 can be implemented in any other of Practical Examples EX1_1 to EX1_4 (i.e., two or more of Practical Examples EX1_1 to EX1_4 can be implemented in combination).

Practical Example EX1_1

Figure 5:
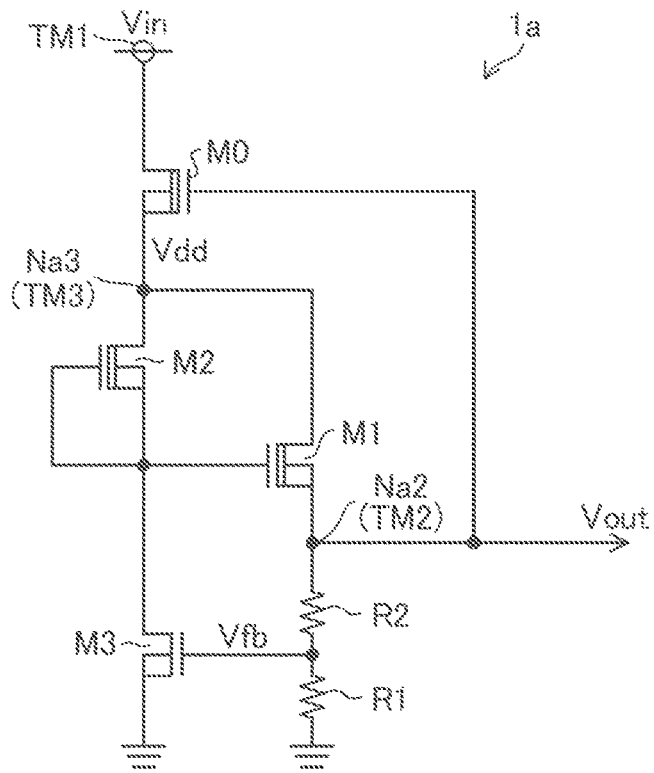
FIG. 5 is a circuit diagram of a power supply circuit according to Practical Example EX1_1 belonging to the first embodiment of the present invention.

Practical Example EX1_1 will be described. FIG. 5 is a configuration diagram of a power supply circuit 1a according to Practical Example EX1_1. The power supply circuit 1a is one example of the power supply circuit 1 in FIG. 3. The power supply circuit 1a includes, in addition to the transistor M0, a regulator, as one example of the regulator 10, composed of transistors M1 to M3 and resistors R1 and R2.

The transistors M1 and M2 are, like the transistor M0, MOSFETs of an N-channel depletion type. The transistor M3 is a MOSFET of an N-channel enhancement type.

In the power supply circuit 1a, nodes Na2 and Na3 correspond to the output terminal TM2 and the internal supply power terminal TM3 respectively. Of the transistors M1 to M3, the transistor M1 functions as an output transistor (hence the transistor M1 will occasionally be referred to as the output transistor). The output current of the power supply circuit 1a, which passes through the node Na2 (output terminal TM2), passes via the output transistor M1.

The drain of the transistor M0 is connected to the input terminal TM1. In the power supply circuit 1a, the source of the transistor M0 and the respective drains of the transistors M1 and M2 are connected together at the node Na3. The gate and the source of the transistor M2, the gate of the transistor M1, and the drain of the transistor M3 are connected together. The source of the transistor M3 is connected to the ground. The source of the transistor M1 and the gate of the transistor M0 are connected to the node Na2.

The node Na2 is connected to one terminal of the resistor R2, and the other terminal of the resistor R2 is connected via the resistor R1 to the ground. Thus, the node Na2 (output terminal TM2) is pulled down through the series circuit composed of the resistors R1 and R2. At the node at which the resistors R1 and R2 are connected together appears a feedback voltage Vfb that is proportional to the output voltage Vout, and the feedback voltage Vfb is fed to the gate of the transistor M3.

In the power supply circuit 1a, the transistors M2 and M3 control the gate voltage of the transistor M1 such that the gate-source voltage of the transistor M3 equals the feedback voltage Vfb. Accordingly, a voltage that is determined by the resistance values of the resistors R1 and R2 and the characteristics of the transistor M3 is taken as the target voltage Vtg of the output voltage Vout, and the on-state resistance value of the output transistor M1 is controlled continuously such that the output voltage Vout equals the target voltage Vtg.

In the power supply circuit 1a, so that it can start up even when the voltage at the node Na3 (internal supply power terminal TM3) equals the voltage $|Vth_{M0}|$, which corresponds to the absolute value of the threshold voltage of the transistor M0 (i.e., so that the output voltage Vout will start to rise from 0 V), the threshold voltage of the transistor M0 is set to be lower than the threshold voltage of the transistor M1.

In the power supply circuit 1a, the transistor M0 can be configured as a high-withstand-voltage element; in that case, even if the transistors M1 to M3 are configured as low-withstand-voltage elements, the entire circuit connected to the transistor M0 can be given a high withstand voltage. Instead, the transistors M0 to M3 can all be configured as low-withstand-voltage or high-withstand-voltage elements.

The regulator in the power supply circuit 1a includes a controller that controls the gate of the output transistor M1 in accordance with the output voltage Vout, and the controller is configured to include the transistors M2 and M3 and the resistors R1 and R2 (similar description applies to the power supply circuits 1b and 1c shown in FIGS. 6 and 7 and described later).

Practical Example EX1_2

Practical Example EX1_2 will be described. The power supply circuit 1a in FIG. 5 can be modified such that the drain of the output transistor M1 is connected not to the node Na3 (internal supply power terminal TM3) but directly to the input terminal TM1. So modifying the power supply circuit 1a gives a power supply circuit 1b configured as shown in FIG. 6.

With the configuration shown in FIG. 5, the currents that pass through the transistors M1 and M2 are both supplied through the transistor M0, and thus the transistor M0 is required to have a current capacity equal to or higher than the sun of the currents that pass through the transistors M1 and M2. On the other hand, owing to the elements constituting the regulator all being on the lower side of the transistor M0, the elements constituting the regulator all have increased tolerance to input variations.

Figure 6:
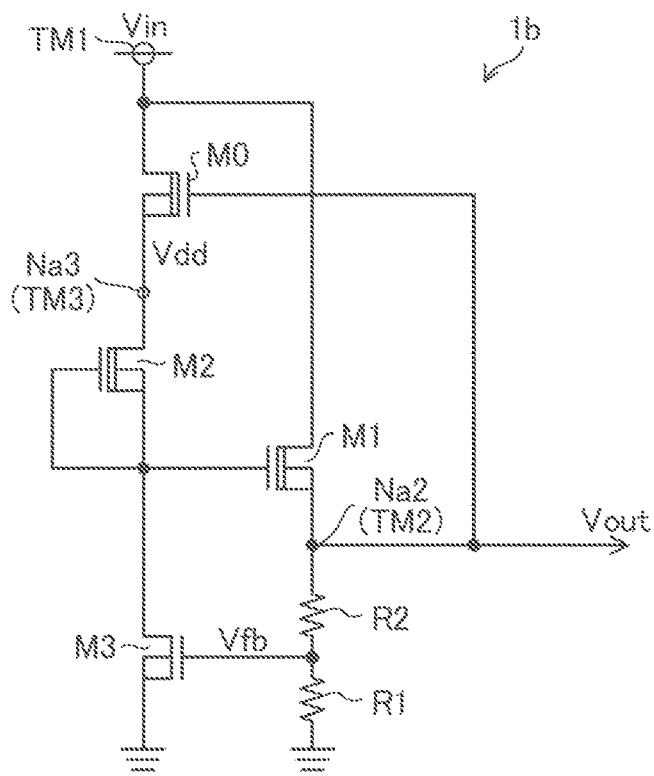
FIG. 6 is a circuit diagram of a power supply circuit according to Practical Example EX1_2 belonging to the first embodiment of the present invention.

However, in a case where, for example, the maximum value of the current that passes through the output transistor M1 is considerably high, the configuration in FIG. 6 permits the use of a transistor with a low current capacity as the transistor M0. With the configuration in FIG. 6, however, as a result of the input voltage Vin being applied directly to the transistor M1, slightly lower ripple suppression performance may result as compared with the configuration in FIG. 5.

In the power supply circuit 1b, the transistors M0 and M1 can be configured as high-witstand-voltage elements; in that case, even if the transistors M2 and M3 are configured as low-withstand-voltage elements, the entire circuit connected to the transistors M0 and M1 can be given a high withstand voltage. Instead, the transistors M0 to M3 can all be configured as low-withstand-voltage or high-withstand-voltage elements.

Practical Example EX1_3

Practical Example EX1_3 will be described. The power supply circuit 1a in FIG. 5 can be modified such that the respective backgates of the transistors M0 and M1 are connected to the ground. So modifying the power supply circuit 1a gives a power supply circuit 1c configured as shown in FIG. 7. Practical Example EX1_3 may be combined with Practical Example EX1_2 described previously. Specifically, in the power supply circuit 1c shown in FIG. 7, the drain of the output transistor M1 can be connected not to the node Na3 (internal supply power terminal TM3) but directly to the input terminal TM1.

Connecting the respective backgates of the transistors M0 and M1 to the ground prevents, in each of the transistors M0 and M1, a parasitic diode from being formed with its forward direction pointing from the source to the drain, and thus helps restrain a reverse current from passing from the source to the drain. In that case, however, due to the substrate bias effect, the target voltage Vtg of the output voltage Vout may be restricted to about 2 V.

Practical Example EX1_4

Figure 8:
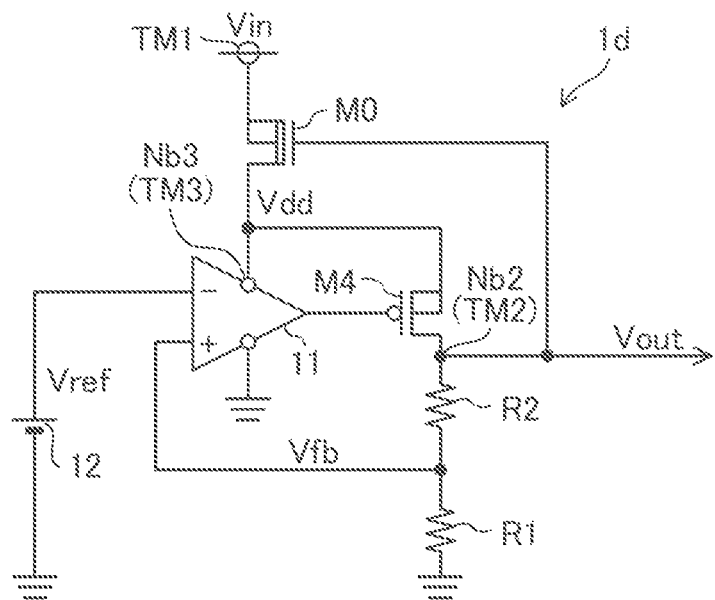
FIG. 8 is a circuit diagram of a power supply circuit according to Practical Example EX1_4 belonging to the first embodiment of the present invention.

Practical Example EX1_4 will be described. FIG. 8 is a configuration diagram of a power supply circuit 1d according to Practical Example EX1_4. The power supply circuit 1d is one example of the power supply circuit 1 in FIG. 3. The power supply circuit 1d includes, in addition to the transistor M0, a regulator, as one example of the regulator 10, composed of a transistor M4, resistors R1 and R2, an amplifier circuit 11, and a reference voltage generator 12.

In the power supply circuit 1d, whereas the transistor M0 is a MOSFET of an N-channel depletion type as mentioned above, the transistor M4 is a MOSFET of a P-channel enhancement type.

In the power supply circuit 1d, nodes Nb2 and Nb3 correspond to the output terminal TM2 and the internal supply power terminal TM3 respectively. In the power supply circuit 1d, the transistor M4 functions as an output transistor (hence the transistor M4 will occasionally be referred to as the output transistor). The output current of the power supply circuit 1d, which passes through the node Nb2 (output terminal TM2), passes via the output transistor M4.

The drain of the transistor M0 is connected to the input terminal TM1. In the power supply circuit 1d, the source of the transistor M0 and the source of the transistor M4 are connected together at the node Nb3. The amplifier circuit 11 is an amplifier that operates by using, as a positive-side supply voltage Vdd, the voltage at the node Nb3 and, as a negative-side supply voltage, the voltage at the ground. The reference voltage generator 12 generates a reference voltage Vref with a predetermined positive direct-current voltage value. The drain of the transistor M4 and the gate of the transistor M0 are connected to the node Nb2.

The node Nb2 is connected to one terminal of the resistor R2, and the other terminal of the resistor R2 is connected via the resistor R1 to the ground. Thus, the node Nb2 (output terminal TM2) is pulled down through the series circuit composed of the resistors R1 and R2. At the node at which the resistors R1 and R2 are connected together appears a feedback voltage Vfb that is proportional to the output voltage Vout. The amplifier circuit 11 has a non-inverting input terminal, an inverting input terminal, and an output terminal. The inverting input terminal of the amplifier circuit 11 is fed with the reference voltage Vref, and the non-inverting input terminal of the amplifier circuit 11 is fed with the feedback voltage Vfb. The output terminal of the amplifier circuit 11 is connected to the gate of the transistor M4.

In the power supply circuit 1d, the amplifier circuit 11 controls the gate voltage of the output transistor M4 such that the feedback voltage Vfb equals the reference voltage Vref. Accordingly, a voltage determined by the resistance values of the resistors R1 and R2 and the reference voltage Vref is taken as the target voltage Vtg of the output voltage Vout, and the on-state resistance value of the output transistor M4 is controlled continuously such that the output voltage Vout equals to target voltage Vtg.

In the power supply circuit 1d, the transistor M0 can be configured as a high-withstand-voltage element; in that case, even if the elements constituting the amplifier circuit 11 are configured as low-withstand-voltage elements, the entire circuit connected to the transistor M0 can be given a high withstand voltage. Instead, the transistor M0 and the elements constituting the amplifier circuit 1 can all be configured as low-withstand-voltage or high-withstand-voltage elements.

The regulator in the power supply circuit 1d includes a controller that controls the gate of the output transistor M4 in accordance with the output voltage Vout, and the controller is configured to include the amplifier circuit 11, the reference voltage generator 12, and the resistors R1 and R2.

It is here assumed that the transistor M0 has a current capacity equal to or higher than the current consumption by the amplifier circuit 11 and that the amplifier circuit 11 is configured to be able to start up with the supply voltage Vdd as it is when the output voltage Vout equals 0 V (i.e., with the supply voltage Vdd at $|Vth_{M0}|$). It is also assumed that the transistor M0 has a current capacity equal to or higher than the sum of the current consumption by the amplifier circuit 11 and the output current of the power supply circuit 1d (i.e., the current that passes through the output transistor M4).

Though not illustrated expressly, in the power supply circuit 1d in FIG. 8, the source of the output transistor M4 can be connected not to the node Nb3 (internal supply power terminal TM3) but directly to the input terminal TM1. This alleviates the requirements on the current capacity of the transistor M0. Also, the output transistor M4 can be configured as a MOSFET of an N-channel enhancement type. In that case, however, the relationship between the source and the drain of the output transistor M4 needs to be reversed, and so do the destinations to which the voltages Vref and Vfb are fed.

Second Embodiment

A second embodiment of the present invention will be described. The second embodiment, and also the third to fifth embodiments described later, is an embodiment based on the first embodiment, and accordingly, for any feature not specifically mentioned in connection with the second to fifth embodiments, unless inconsistent, the description of that feature given in connection with the first embodiment applies to the second to fifth embodiments. In interpreting the description of the second embodiment, for any feature that contradicts between the first and second embodiments, the description of that feature given in connection with the second embodiment can prevail (the same applies to the third to fifth embodiments described later). Unless inconsistent, any one or more of the first to fifth embodiments can be combined together.

With the power supply circuit 1 in FIG. 3, it is a necessary condition that the regulator 10 start up and the output voltage Vout start to rise in a state where the magnitude of the supply voltage Vdd at the internal supply power terminal TM3 is equal to the magnitude (for example, 0.4 V) of the threshold voltage of the transistor M0. A configuration with which fulfillment of this necessary condition is not necessarily required will now be described as a second embodiment.

Figure 9:
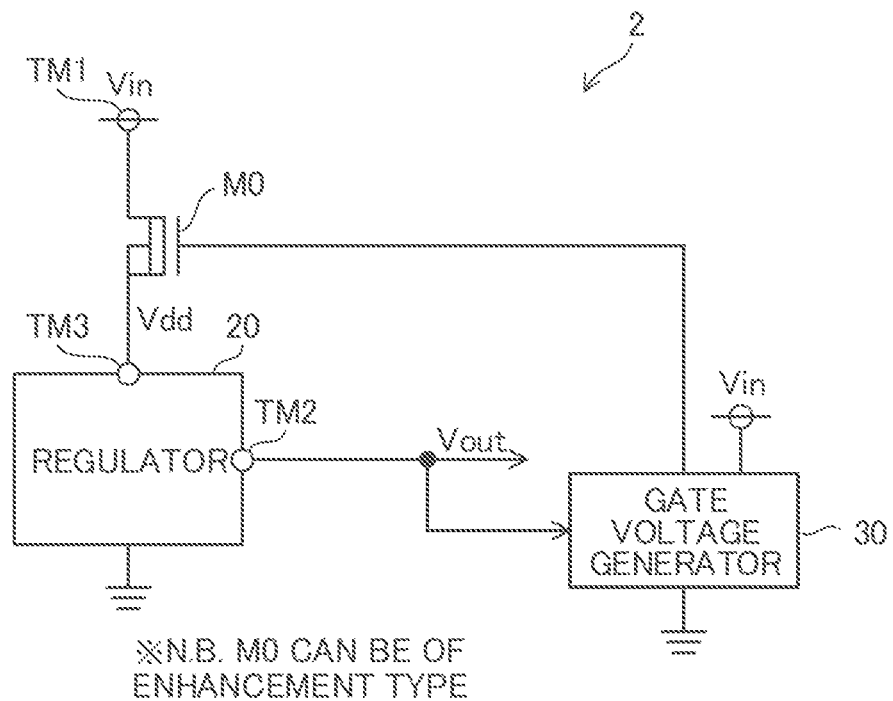
FIG. 9 is a schematic configuration diagram of a power supply circuit according to a second embodiment of the present invention.

FIG. 9 is a schematic configuration diagram of a power supply circuit 2 according to the second embodiment of the present invention. The power supply circuit 2 can be fabricated in the form of a semiconductor integrated circuit. The power supply circuit 2 is a linear power supply circuit that generates the output voltage Vout by bucking (stepping down) the input voltage Vin. Except in a transient state, the input voltage Vin and the output voltage Vout each have a predetermined positive voltage value.

The power supply circuit 2 includes a transistor M0, a regulator 20, and a gate voltage generator 30, and further includes: an input terminal TM1, to which the input voltage Vin is applied; an output terminal TM2, to which the output voltage Vout is applied; and an internal supply power terminal TM3. A voltage Vdd that is applied to the internal supply power terminal TM3 serves as the supply voltage to the regulator 20.

The transistor M0 is a MOSFET of an N-channel depletion type. Accordingly, the threshold voltage of the transistor M0 has a negative voltage value (e.g., −0.4 V). The transistor M0 is inserted between the input terminal TM1 and the internal supply power terminal TM3. More specifically, the drain of the transistor M0 is connected to the input terminal TM1, and the source of the transistor M0 is connected to the internal supply power terminal TM3.

The regulator 20 is a linear regulator that generates the output voltage Vout by using, as the supply voltage to it, the voltage Vdd applied to the internal supply power terminal TM3. The output voltage Vout generated by the regulator 20 is output via the output terminal TM2. Though not shown in FIG. 9, the output terminal TM2 is pulled down.

The gate voltage generator 30 is connected to the output terminal TM2. The gate voltage generator 30 generates a voltage commensurate with the output voltage Vout, and feeds the generated voltage, as the gate voltage of the transistor M0, to the gate of the transistor M0. The gate voltage generator 30 is supplied with the input voltage Vin, and the gate voltage generator 30 uses the input voltage Vin to generate the gate voltage of the transistor M0.

The gate voltage generator 30 can be a circuit that generates the gate voltage of the transistor M0 by shifting the level of the output voltage Vout. The gate voltage generator 30 is so configured that, when the output voltage Vout equals 0 V (when it has a ground potential), it feeds a positive voltage based on the input voltage Vin to the gate of the transistor M0.

This eliminates the need to necessarily fulfill the necessary condition mentioned above. That is, the restrictions on the regulator 20 are alleviated. The alleviated restrictions allow increased flexibility in the choice and design of elements, and lead to space saving and cost reduction. Also with the power supply circuit 2, it is possible to obtain workings and effects (such as high ripple suppression performance) similar to those obtained with the power supply circuit 1 of the first embodiment.

Depending on the configuration of the gate voltage generator 30, the transistor M0 in the second embodiment can instead be a MOSFET of an N-channel enhancement type.

The second embodiment includes Practical Examples EX2_1 to EX2_6 presented below. Unless otherwise stated, or unless inconsistent, any feature described above in connection with the second embodiment applies to Practical Examples EX2_1 to EX2_6 presented below; for any feature described in connection with any of the practical examples that contradicts a feature described above in connection with the second embodiment, the description of that featue given in connection with that practical example can prevail. Unless inconsistent, any feature of any of Practical Examples EX2_1 to EX2_6 can be implemented in any other of Practical Examples EX2_1 to EX2_6 (i.e., two or more of Practical Examples EX2_1 to EX2_6 can be implemented in combination).

Practical Example EX2_1

Figure 10:
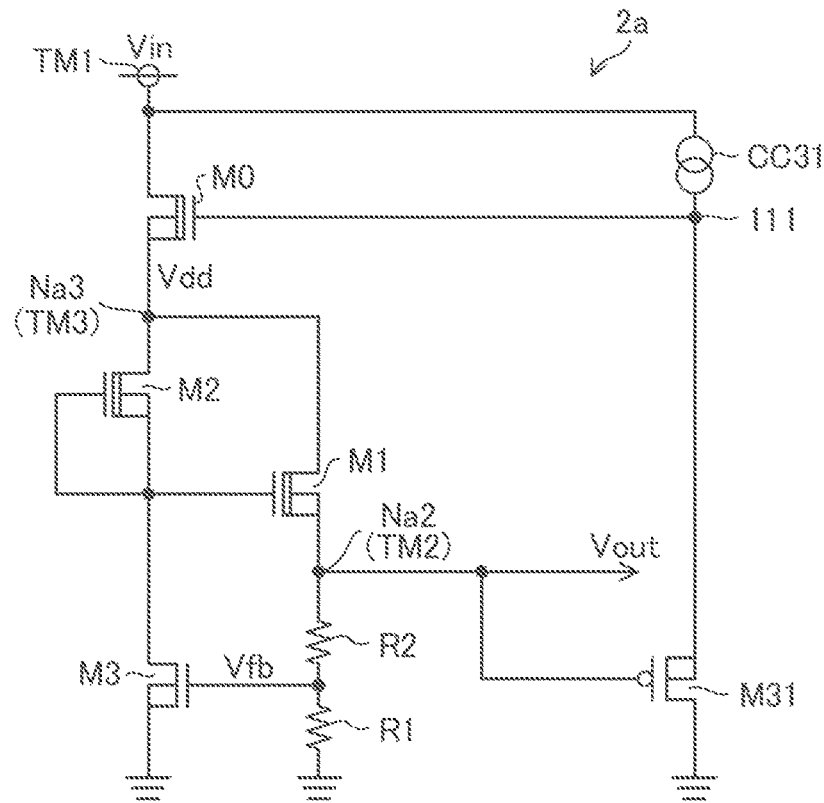
FIG. 10 is a circuit diagram of a power supply circuit according to Practical Example EX2_1 belonging to the second embodiment of the present invention.

Practical Example EX2_1 will be described. FIG. 10 is a configuration diagram of a power supply circuit 2a according to Practical Example EX2_1. The power supply circuit 2a is one example of the power supply circuit 2 in FIG. 9. The power supply circuit 2a includes, in addition to the transistor M0: a regulator, as one example of the regulator 20, composed of transistors M1 to M3 and resistors R1 and R2; and a gate voltage generator, as one example of the gate voltage generator 30, composed of a transistor M31 and a constant current source CC31.

In the power supply circuit 2a in FIG. 10, the transistors M0 to M2 are MOSFETs of an N-channel depletion type, the transistor M3 is a MOSFET of an N-channel enhancement type, and the transistor M31 is a MOSFET of a P-channel enhancement type. In the power supply circuit 2a, nodes Na2 and Na3 correspond to the output terminal TM2 and the internal supply power terminal TM3 respectively. Of the transistors M1 to M3, the transistor M functions as an output transistor (hence the transistor M1 will occasionally be referred to as the output transistor). The output current of the power supply circuit 2a, which passes through the node Na2 (output terminal TM2), passes via the output transistor M1.

In the power supply circuit 2a, the drain of the transistor M0 is connected to the input terminal TM1. The source of the transistor M0 and the respective drains of the transistors N1 and M2 are connected together at the node Na3. The gate and the source of the transistor M2, the gate of the transistor M1, and the drain of the transistor M3 are connected together. The source of the transistor M3 is connected to the ground. The source of the transistor M1 is connected to the node Na2. The node Na2 is connected to one terminal of the resistor R2, and the other terminal of the resistor R2 is connected via the resistor R1 to the ground. Thus, the node Na2 (output terminal TM2) is pulled down through the series circuit composed of the resistors R1 and R2. At the node at which the resistor R1 and R2 are connected together appears a feedback voltage Vfb that is proportional to the output voltage Vout, and the feedback voltage Vfb is fed to the gate of the transistor M3.

In the power supply circuit 2a, the transistors M2 and M3 control the gate voltage of the transistor M1 such that the gate-source voltage of the transistor M3 equals the feedback voltage Vfb. Accordingly, a voltage that is determined by the resistance values of the resistors R1 and R2 and the characteristics of the transistor M3 is taken as the target voltage Vtg of the output voltage Vout, and the on-state resistance value of the output transistor M1 is controlled continuously such that the output voltage Vout equals the target voltage Vtg.

On the other hand, the node Na2 is connected to the gate of the transistor M31, and the drain of the transistor M31 is connected to the ground. The gate of the transistor M0 is connected to a node 111. The node 111 is connected also to the source of the transistor M31. The constant current source CC31 is provided between the input terminal TM1 and the node 111. The constant current source CC31 so operates that a constant current that it generates based on the input voltage Vin passes from the input terminal TM1 to the node 111. The power supply circuit 2a can be modified such that the constant current source CC31 is replaced with a resistor.

When the threshold voltage of the transistor M31 is represented by the symbol $Vth_{M31}$, the gate voltage of the transistor M0 is $(Vout+Vth_{M31})$. That is, a voltage resulting from shifting the level of the output voltage Vout by the threshold voltage $Vth_{M31}$ is taken as the gate voltage of the transistor M0. Then, the voltage Vdd at the node Na3 is the voltage $(Vout+Vth_{M31}+Vth|_{M0}|)$. That is, when the input voltage Vin starts to be supplied (when, for example, an input voltage Vin such that Va=Vin starts to be supplied; see FIG. 4, even if the output voltage Vout equals 0 V, the gate of the transistor M0 is fed with a positive voltage ($Vth_{M31}$) based on the input voltage Vin; consequently a voltage $(Vth_{M31}+|Vth_{M0}|)$ is applied to the node Na3. Thus, the regulator in the power supply circuit 2a only needs to be configured such that it can start up in a state where $Vdd=Vth_{M31}+|Vt_{M0}|$ (i.e., such that the output voltage Vout can rise from 0 V).

In the power supply circuit 2a, even if the output voltage Vout equals 0 V, the gate of the transistor M0 is fed with the voltage $Vth_{M31}$. Thus, the transistor M0 can instead be a MOSFET of an N-channel enhancement type; or the output transistor M1 can instead be a MOSFET of an N-channel enhancement type.

Figure 11:
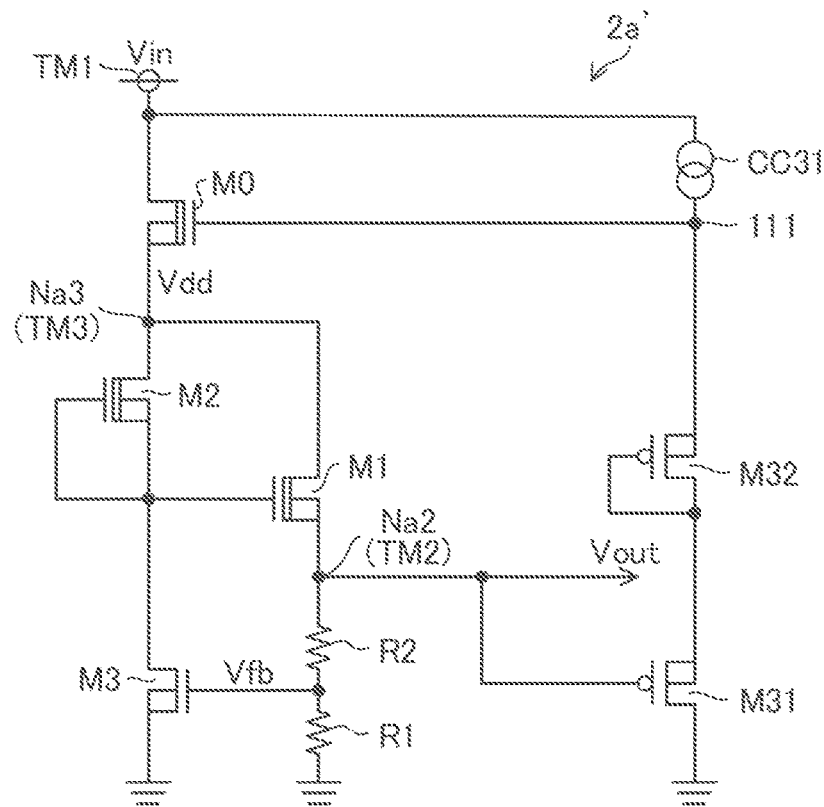
FIG. 11 is a modified circuit diagram of the power supply circuit according to Practical Example EX2_1 belonging to the second embodiment of the present invention.

One or more diode-connected MOSFETs of a P-channel enhancement type can be added between the node 111 and the source of the transistor M31 in such a direction as to raise the potential at the node 111. This gives the circuit increased versatility. FIG. 11 shows the configuration of a power supply circuit 2a' where one such additional MOSFET M32 (diode-connected MOSFET of a P-channel enhancement type) is added.

In the power supply circuit 2a, the transistor M0 can be configured as a high-withstand-voltage element; in that case, even if the transistors M1 to M3 are configured as low-withstand-voltage elements, the entire circuit connected to the transistor M0 can be given a high withstand voltage. Instead, the transistors M0 to M3 can all be configured as low-withstand-voltage or high-withstand-voltage elements. The elements (in FIG. 11. CC31 and M31) constituting the gate voltage generator can be given an adequate withstand voltage in accordance with the withstand voltage required in the entire circuit.

Figure 7:
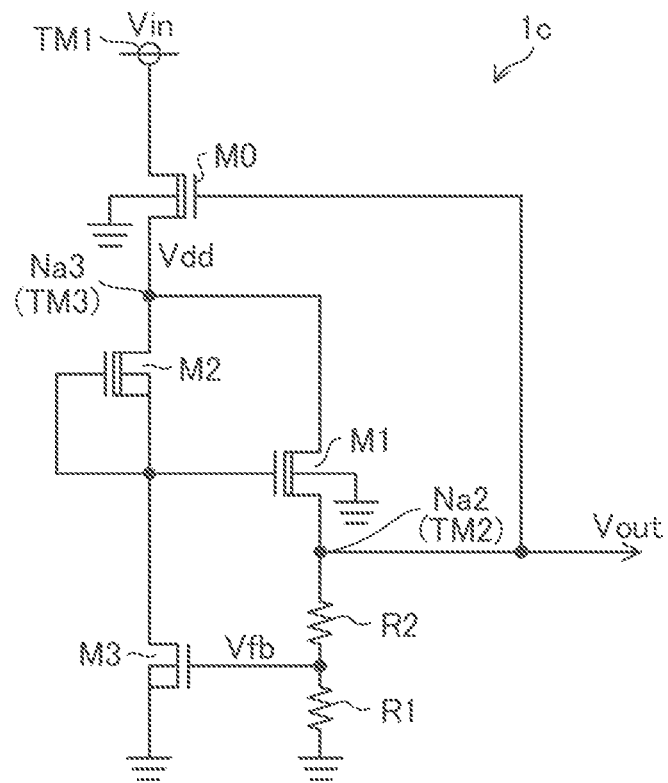
FIG. 7 is a circuit diagram of a power supply circuit according to Practical Example EX1_3 belonging to the first embodiment of the present invention.

As the power supply circuit 1a in FIG. 5 can be modified into the power supply circuit 1b in FIG. 6 or the power supply circuit 1c in FIG. 7, so the power supply circuit 2a can be modified such that the drain of the output transistor M1 is connected not to the node Na3 (internal supply power terminal TM3) but directly to the input terminal TM1 or such that the respective backgates of the transistors M0 and M1 are connected to the ground.

The regulator in the power supply circuit 2a includes a controller that controls the gate of the output transistor M1 in accordance with the output voltage Vout, and the controller is configured to include the transistors M2 and M3 and the resistors R1 and R2.

Practical Example EX2_2

Figure 12:
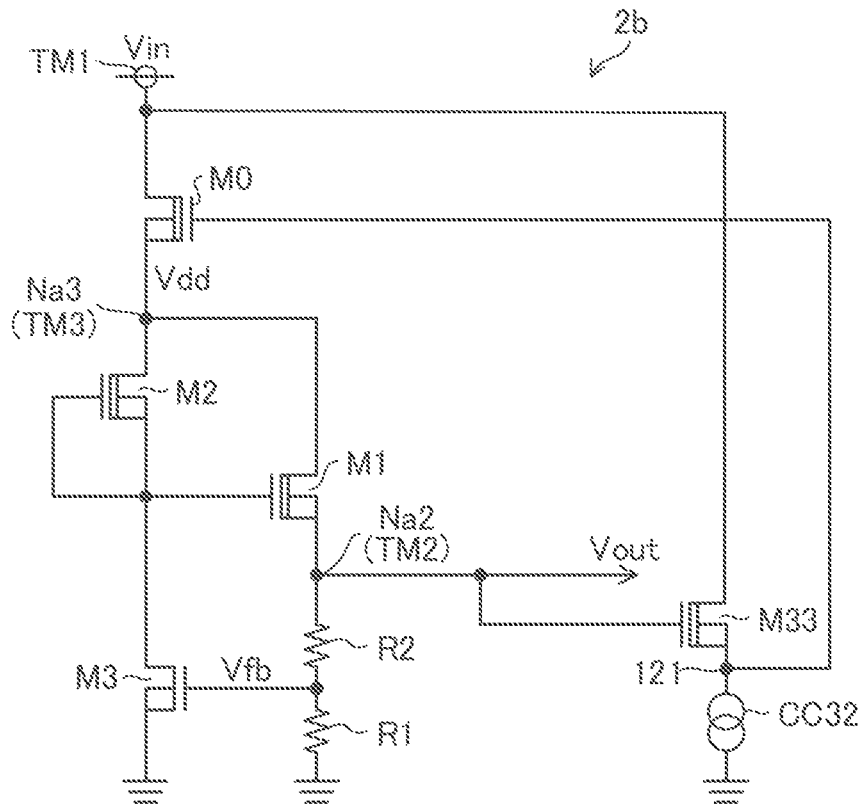
FIG. 12 is a circuit diagram of a power supply circuit according to Practical Example EX2_2 belonging to the second embodiment of the present invention.

Practical Example EX2-2 will be described. FIG. 12 is a configuration diagram of a power supply circuit 2b according to Practical Example EX2_2. The power supply circuit 2b is one example of the power supply circuit 2 in FIG. 9. The power supply circuit 2b results from partly modifying the power supply circuit 2a in FIG. 10. Accordingly, for any feature not specifically mentioned in connection with Practical Example EX2_2, unless inconsistent, the description of that feature given in connection with the Practical Example EX2_1 can apply to Practical Example EX2_2. The power supply circuit 2b includes, in addition to the transistor M0: a regulator, as one example of the regulator 20, composed of transistors M1 to M3 and resistors R1 and R2; and a gate voltage generator, as one example of the gate voltage generator 30, composed of a transistor M33 and a constant current source CC32. The transistor M33 is a MOSFET of an N-channel depletion type.

In the power supply circuit 2b, nodes Na2 and Na3 correspond to the output terminal TM2 and the internal supply power terminal TM3 respectively. In the power supply circuit 2b, the interconnection among the transistors M0 to M3, the resistors R1 and R2, the input terminal TM1, and the nodes Na2 and Na3 and the operation of these elements are the same as in the power supply circuit 2a in FIG. 10 (i.e., as described in connection with Practical Example EX2_1).

The interconnection and the operation of the other elements in the power supply circuit 2b will be described. The gate of the transistor M33 is connected to the node Na2. The drain of the transistor M33 is connected to the input terminal TM1. Instead, the drain of the transistor M33 can be connected to the node Na3. The source of the transistor M33 and the gate of the transistor M0 are connected together at a node 121. The constant current source CC32 is provided between the node 121 and the ground. The constant current source CC32 so operates that a constant current that it generates based on the input voltage Vin passes from the node 121 to the ground. The power supply circuit 2b can be modified such that the constant current source CC32 is replaced with a resistor.

Thus, when the threshold voltage of the transistor M33 is represented by the symbol $Vth_{M33}$, the gate voltage of the transistor M0 is $(Vout-Vth_{M33})$. That is, a voltage resulting from shifting the level of the output voltage Vout by the threshold voltage $Vth_{M33}$ is taken as the gate voltage of the transistor M0. The threshold voltage $Vth_{M33}$ has a negative voltage value. When the absolute value of the threshold voltage $Vth_{M33}$ is represented by $|Vth_{M33}|$, the voltage Vdd at the node Na3 is the voltage $(Vout+|Vth_{M33}|+|Vth_{M0}|)$. That is, when the input voltage Vin starts to be supplied (when, for example, an input voltage Vin such that Va=Vin starts to be supplied; see FIG. 4) even if the output voltage Vout equals 0 V, the gate of the transistor M0 is fed with a positive voltage (|Vth$_{M33}$|) based on the input voltage Vin; consequently a voltage (|Vth$_{M33}$|+|Vth$_{M0}$|) is applied to the node Na3. Thus, the regulator in the power supply circuit 2*b* only needs to be configured such that it can start up in a state where Vdd=|Vth$_{M33}$|+|Vth$_{M0}$| (i.e., such that the output voltage Vout can rise from 0 V).

In the power supply circuit 2*b*, even if the output voltage Vout equals 0 V, the gate of the transistor M0 is fed with the voltage |Vth$_{M33}$|. Thus, the transistor M0 can instead be a MOSFET of an N-channel enhancement type; or the output transistor M1 can instead be a MOSFET of an N-channel enhancement type.

Practical Example EX2_3

Figure 13:
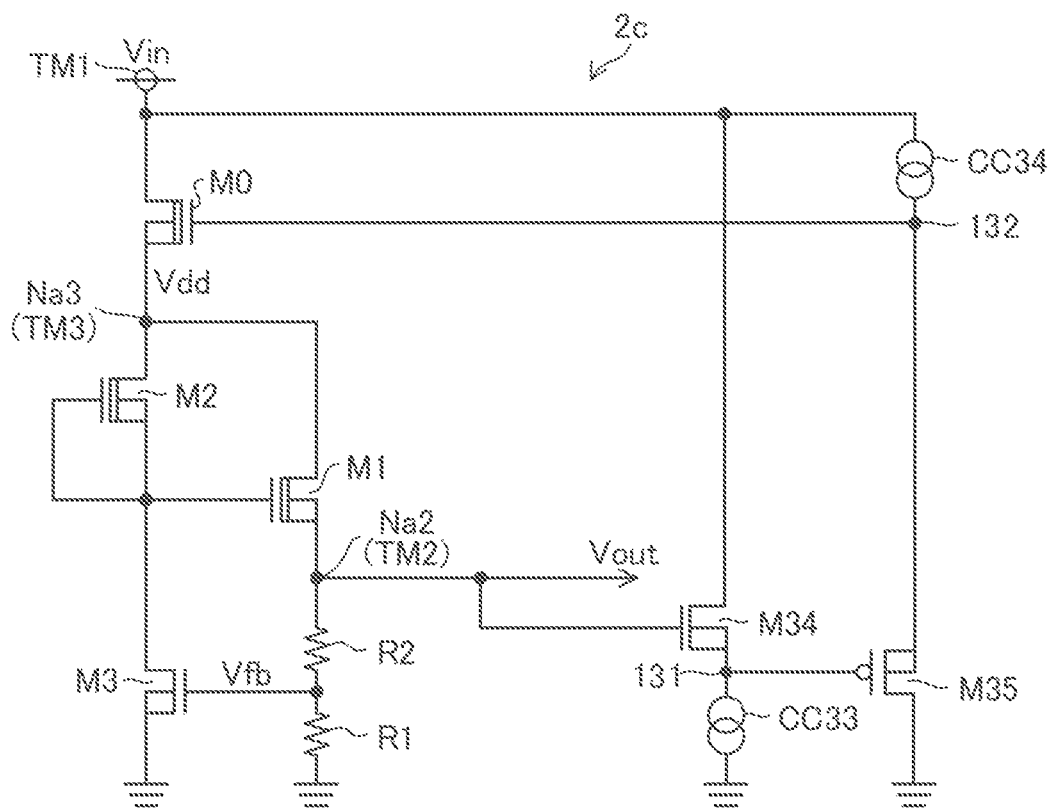
FIG. 13 is a circuit diagram of a power supply circuit according to Practical Example EX2_3 belonging to the second embodiment of the present invention.

Practical Example EX2_3 will be described. FIG. 13 is a configuration diagram of a power supply circuit 2*c* according to Practical Example EX2_3. The power supply circuit 2*c* is one example of the power supply circuit 2 in FIG. 9. The power supply circuit 2*c* results from partly modifying the power supply circuit 2*a* in FIG. 10. Accordingly, for any feature not specifically mentioned in connection with Practical Example EX2_3, unless inconsistent, the description of that feature given in connection with the Practical Example EX2_1 can apply to Practical Example EX2_3. The power supply circuit 2*c* includes, in addition to the transistor M0: a regulator, as one example of the regulator 20, composed of transistors M1 to M3 and resistors R1 and R2; and a gate voltage generator, as one example of the gate voltage generator 30, composed of transistors M34 and M35 and constant current sources CC33 and CC34. The transistor M34 is a MOSFET of an N-channel enhancement type, and the transistor M35 is a MOSFET of a P-channel enhancement type.

In the power supply circuit 2*c*, nodes Na2 and Na3 correspond to the output terminal TM2 and the internal supply power terminal TM3 respectively. In the power supply circuit 2*c*, the interconnection among the transistors M0 to M3, the resistors R1 and R2, the input terminal TM1, and the nodes Na2 and N3 and the operation of these elements are the same as in the power supply circuit 2*a* in FIG. 10 (i.e., as described in connection with Practical Example EX2_1.

The interconnection and the operation of the other elements in the power supply circuit 2*c* will be described. The gate of the transistor M34 is connected to the node Na2. The drain of the transistor M34 is connected to the input terminal TM1. Instead, the drain of the transistor M34 can be connected to the node Na3. The source of the transistor M34 and the gate of the transistor M35 are connected together at a node 131. The constant current source CC33 is provided between the node 131 and the ground. The constant current source CC33 so operates that a constant current that it generates based on the input voltage Vin passes from the node 131 to the ground. The drain of the transistor M35 is connected to the ground. The gate of the transistor M0 is connected to a node 132. The node 132 is connected also to the source of the transistor M35. The constant current source CC34 is provided between the input terminal TM1 and the node 132. The constant current source CC34 so operates that a constant current that it generates based on the input voltage Vin passes from the input terminal TM1 to the node 132. The power supply circuit 2*c* can be modified such that one or both of the constant current sources CC33 and CC34 are replaced with a resistor.

The threshold voltages of the transistors M34 and M35 are represented by the symbols Vth$_{M34}$ and Vth$_{M35}$ respectively. When the input voltage Vin starts to be supplied (when, for example, an input voltage Vin such that Va=Vin starts to be supplied; see FIG. 4), in a state where the regulator is yet to start up (i.e., in a state where the output voltage Vout equals 0 V), a positive voltage that is determined by the configuration and the operation of the constant current source CC34 (i.e., a positive voltage based on the input voltage Vin) is applied to the gate of the transistor M0, and a positive voltage Vdd higher than the absolute value |Vth$_{M0}$| of the threshold voltage of the transistor M0 is applied to the node Na3. Thus, the regulator starts up. When the output voltage Vout becomes equal to or higher than the threshold voltage Vth$_{M34}$ of the transistor M34, a voltage resulting from shifting the level of the output voltage Vout by the voltage (−Vth$_{M34}$+Vth$_{M35}$) is taken as the gate voltage of the transistor M0. Thus, a voltage determined by the characteristics of the transistors M34 and M35 with reference to the output voltage Vout is taken as the supply voltage Vdd to the regulator.

Practical Example EX2_4

Figure 14:
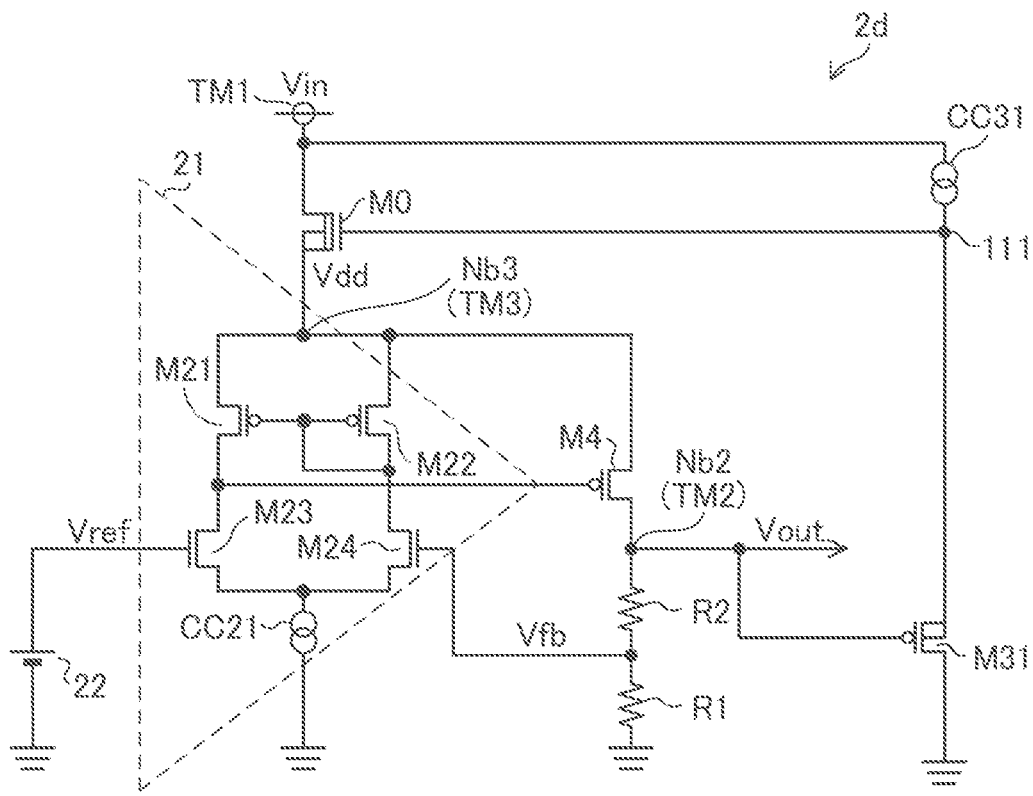
FIG. 14 is a circuit diagram of a power supply circuit according to Practical Example EX2_4 belonging to the second embodiment of the present invention.

Practical Example EX2_4 will be described. The technology described previously in connection with the second embodiment is applicable to a regulator that is configured to include an amplifier circuit. FIG. 14 is a configuration diagram of a power supply circuit 2*d* according to Practical Example EX2_4. The power supply circuit 2*d* is one example of the power supply circuit 2 in FIG. 9. In the power supply circuit 2*d*, a technology similar to that underlying Practical Example EX2_1 (FIG. 10) is applied to a regulator configured to include an amplifier circuit. The power supply circuit 2*d* includes, in addition to the transistor M0: a regulator, as one example of the regulator 20, composed of an amplifier circuit 21, a reference voltage generator 22, a transistor M4, and resistors R1 and R2; and a gate voltage generator, as one example of the gate voltage generator 30, composed of a transistor M31 and a constant current source CC31. The transistor M4 can be understood to be included among the elements constituting the amplifier circuit 21.

In the power supply circuit 2*d*, the transistor M0 is a MOSFET of an N-channel depletion type. The amplifier circuit 21 is composed of transistors M21 to M24 and a constant current source CC21. The transistors M23 and M24 are MOSFETs of an N-channel enhancement type. The transistors M4, M21, M22, and M31 are MOSFETs of a P-channel enhancement type.

In the power supply circuit 2*d*, nodes Nb2 and Nb3 correspond to the output terminal TM2 and the internal supply power terminal TM3 respectively. In the power supply circuit 2*d*, the transistor M4 functions as an output transistor (hence the transistor M4 will occasionally be referred to as the output transistor). The output current of the power supply circuit 2*d*, which passes through the node Nb2 (output terminal TM2), passes via the output transistor M4. The amplifier circuit 21 is an amplifier that operates by using, as a positive-side supply voltage Vdd, the voltage at the node Nb3 and, as a negative-side supply voltage, the voltage at the ground. The reference voltage generator 22 generates a reference voltage Vref with a predetermined positive direct-current voltage value.

The drain of the transistor M0 is connected to the input terminal TM1. In the power supply circuit 2*d*, the source of the transistor M0 and the source of the transistor M4 are connected together at the node Nb3. The drain of the transistor M4 is connected to the node Nb2.

The sources of the transistors M21 and M22 are connected together at the node Nb3. The respective drains of the transistors M21 and M23 and the gate of the output transistor M4 are connected together. The gate of the transistor M21, the gate and the drain of the transistor M22, and the drain of the transistor M24 are connected together. The respective sources of the transistors M23 and M24 are connected together at one terminal of the constant current source CC21 The other terminal of the constant current source CC21 is connected to the ground. The constant current source CC21 so operates that a constant current passes from the respective sources of the transistors M23 and M24 to the ground.

The node Nb2 is connected to one terminal of the resistor R2, and the other terminal of the resistor R2 is connected via the resistor R1 to the ground. Thus, the node Nb2 (output terminal TM2) is pulled down through the series circuit composed of the resistors R1 and R2. At the node at which the resistors R1 and R2 are connected together appears a feedback voltage Vfb that is proportional to the output voltage Vout. The amplifier circuit 21 has a non-inverting input terminal, an inverting input terminal, and an output terminal. The gate of the transistor M23, which corresponds to the inverting input terminal of the amplifier circuit 21, is fed with the reference voltage Vref, and the gate of the transistor M24, which corresponds to the non-inverting input terminal of the amplifier circuit 21, is fed with the feedback voltage Vfb. The connection node at which the drains of the transistors M21 and M23 are connected together corresponds to the output terminal of the amplifier circuit 21, and this output terminal is connected to the gate of the output transistor M4.

In the power supply circuit 2d, the amplifier circuit 21 controls the gate voltage of the output transistor M4 such that the feedback voltage Vfb equals the reference voltage Vref. Accordingly, a voltage that is determined by the resistance values of the resistors R1 and R2 and the reference voltage Vref is taken as the target voltage Vtg of the output voltage Vout, and the on-state resistance value of the output transistor M4 is controlled continuously such that the output voltage Vout equals the target voltage Vtg.

On the other hand, the node Nb2 is connected to the gate of the transistor M31, and the drain of the transistor M31 is connected to the ground. The gate of the transistor M0 is connected to a node 111. The node 111 is connected also to the source of the transistor M31. The constant current source CC31 is provided between the input terminal TM1 and the node 111. The constant current source CC31 so operates that a constant current that it generates based on the input voltage Vin passes from the input terminal TM1 to the node 111. The power supply circuit 2d can be modified such that the constant current source CC31 is replaced with a resistor.

When the threshold voltage of the transistor M31 is represented by the symbol $Vth_{M31}$, the gate voltage of the transistor M0 is $(Vout+Vth_{M31})$. That is, a voltage resulting from shifting the level of the output voltage Vout by the threshold voltage $Vth_{M31}$ is taken as the gate voltage of the transistor M0. Then, the voltage Vdd at the node Nb3 is the voltage $(Vout+Vth_{M31}+|Vth_{M0}|)$. That is, when the input voltage Vin starts to be supplied (when, for example, an input voltage Vin such that Va=Vin starts to be supplied; see FIG. 4), even if the output voltage Vout equals 0 V, the gate of the transistor M0 is fed with a positive voltage $(Vth_{M31})$ based on the input voltage Vin; consequently a voltage $(Vth_{M31}+|Vth_{M0}|)$ is applied to the node Nb3. Thus, the regulator in the power supply circuit 2d only needs to be configured such that the regulator including the amplifier circuit 21 can start up in a state where $Vdd=Vth_{M31}+|Vth_{M0}|$ (i.e., such that the output voltage Vout can rise from 0 V).

In the power supply circuit 2d, even if the output voltage Vout equals 0 V, the gate of the transistor M0 is led with the voltage $Vth_{M31}$. Thus, the transistor M0 can instead be a MOSFET of an N-channel enhancement type.

Figure 15:
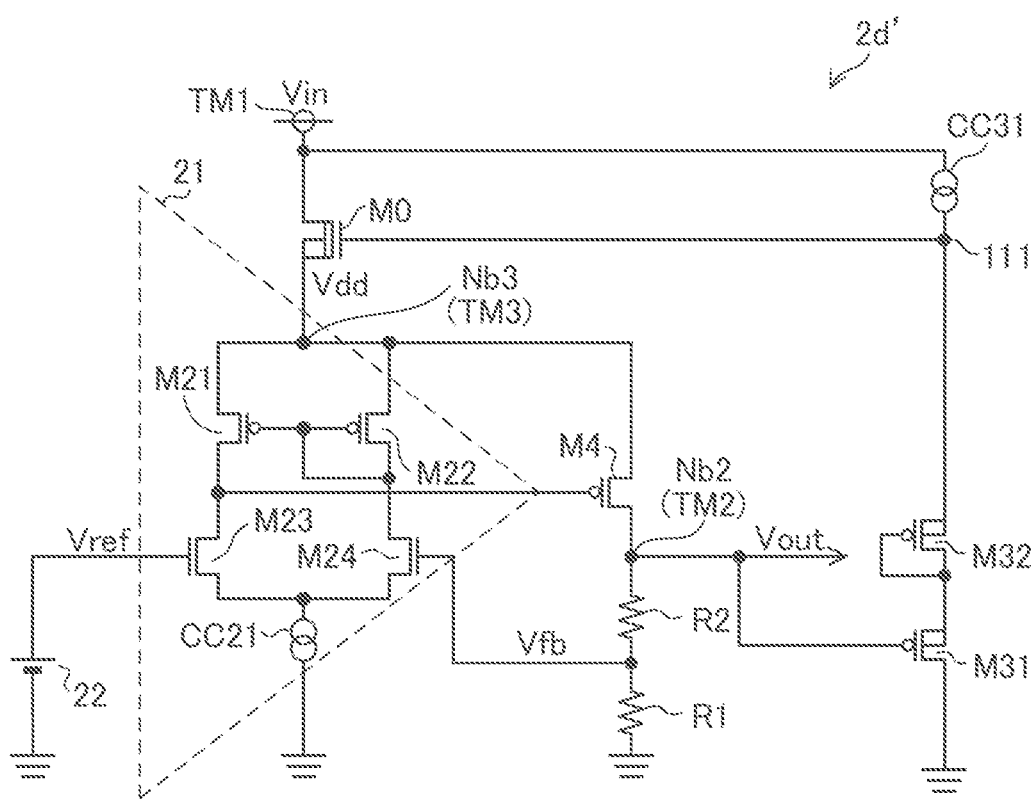
FIG. 15 is a modified circuit diagram of the power supply circuit according to Practical Example EX2_4 belonging to the second embodiment of the present invention.

One or more diode-connected MOSFETs of a P-channel enhancement type can be added between the node 111 and the source of the transistor M31 in such a direction as to raise the potential at the node 111. This gives the circuit increased versatility. FIG. 15 shows the configuration of a power supply circuit 2d' where one such additional MOSFET M32 (diode-connected MOSFET of a P-channel enhancement type) is added.

Figure 16:
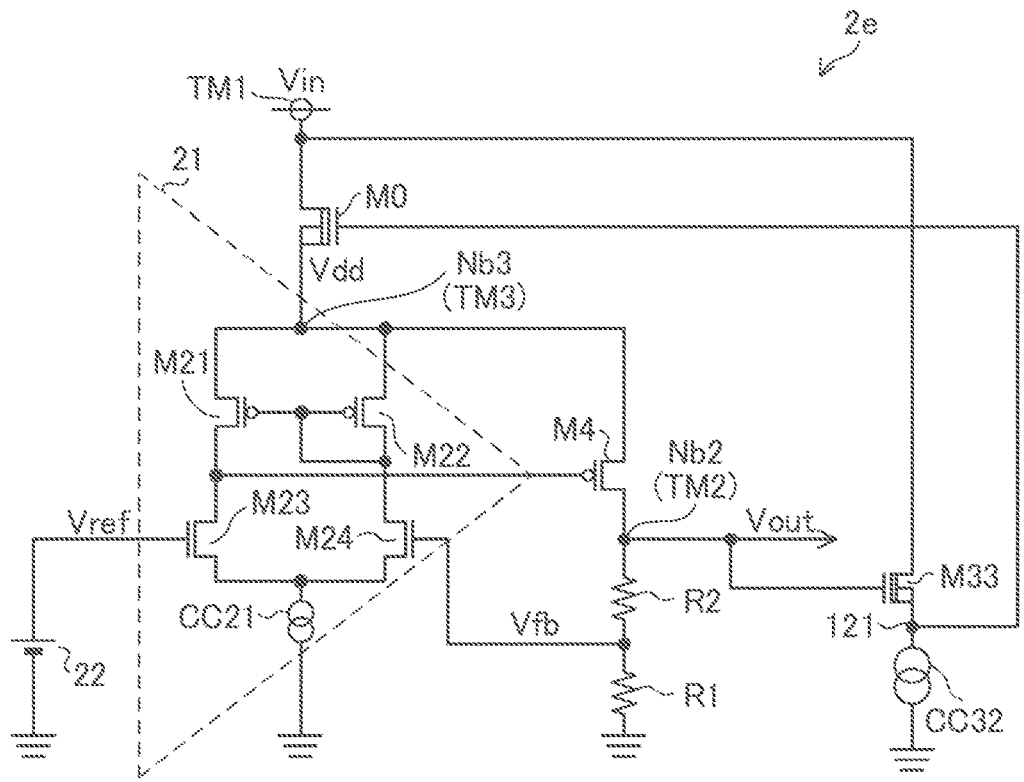
FIG. 16 is a circuit diagram of a power supply circuit according to Example EX2_5 belonging to the second embodiment of the present invention.
Figure 17:
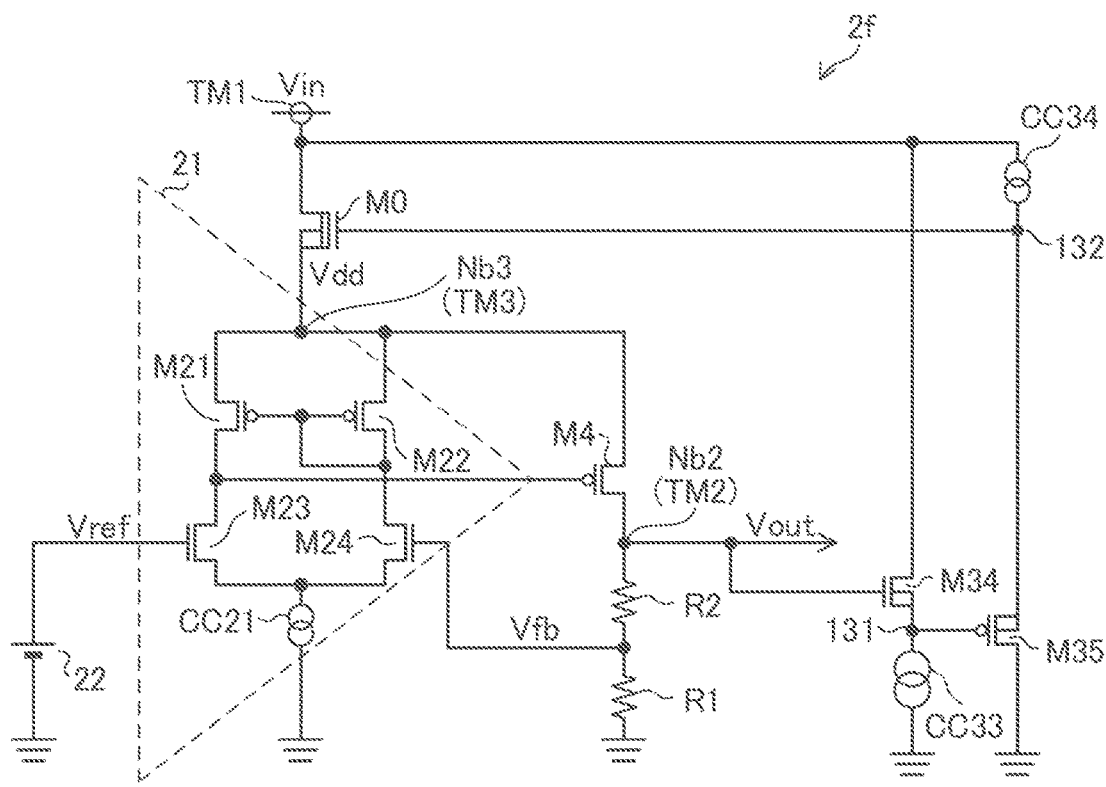
FIG. 17 is a circuit diagram of a power supply circuit according to Example EX2_-6 belonging to the second embodiment of the present invention.

In the power supply circuit 2d, the transistor M0 can be configured as a high-withstand-voltage element; in that case, even if the transistors M4 and M21 to M24 are configured as low-withstand-voltage elements, the entire circuit connected to the transistor M0 can be given a high withstand voltage (the same applies to the power supply circuits 2e and 2f shown in FIGS. 16 and 17 and described later). Instead, those transistors can all be configured as low-withstand-voltage or high-withstand-voltage elements (the same applies to the power supply circuits 2e and 2f shown in FIGS. 16 and 17 and described later).

The regulator in the power supply circuit 2d includes a controller that controls the gate of the output transistor M4 in accordance with the output voltage Vout, and the controller is configured to include the amplifier circuit 21, the reference voltage generator 22, and the resistors R1 and R2.

It is here assumed that the transistor M0 has a current capacity equal to or higher than the sum of the current consumption by the amplifier circuit 21 and the output current of the power supply circuit 2d (i.e., the current that passes through the output transistor M4). Though not illustrated expressly, in the power supply circuit 2d in FIG. 14, the source of the output transistor M4 can be connected not to the node Nb3 (internal supply power terminal TM3) but directly to the input terminal TM1. This alleviates the requirements on the current capacity of the transistor M0.

The output transistor M4 can be configured as a MOSFET of an N-channel enhancement type. In that case, however, the relationship between the source and the drain of the output transistor M4 needs to be reversed, and so do the destinations to which the voltages Vref and Vfb are fed.

Practical Example EX2_5

Practical Example EX2_5 will be described. FIG. 16 is a configuration diagram of a power supply circuit 2e according to Practical Example EX2_5. The power supply circuit 2e is one example of the power supply circuit 2 in FIG. 9. The power supply circuit 2e results from partly modifying the power supply circuit 2d in FIG. 14. Accordingly, for any feature not specifically mentioned in connection with Practical Example EX2_5, unless inconsistent, the description of that feature given in connection with the Practical Example EX2_4 can apply to Practical Example EX2_5. In the power supply circuit 2e, a technology similar to that underlying Practical Example EX2_2 (FIG. 12) is applied to a regulator configured to include an amplifier circuit. The power supply circuit 2e includes, in addition to the transistor M0: a regulator, as one example of the regulator 20, composed of an amplifier circuit 21, a reference voltage generator 22, a transistor M4, and resistors R1 and R2; and a gate voltage generator, as one example of the gate voltage generator 30, composed of a transistor M33 and a constant current source CC32. The transistor M33 is a MOSFET of an N-channel depletion type. The transistor M4 can be understood to be included among the elements constituting the amplifier circuit 21.

In the power supply circuit 2e, nodes Nb2 and Nb3 correspond to the output terminal TM2 and the internal supply power terminal TM3 respectively. In the power supply circuit 2e, the interconnection among the transistors M0, M4, and M21 to M24, the resistors R1 and R2, the reference voltage generator 22, the constant current source CC21, the input terminal TM1, and the nodes Nb2 and Nb3 and the operation of these elements are the same as in the power supply circuit 2d in FIG. 14 (i.e., as described in connection with Practical Example EX2_4).

The interconnection and the operation of the other elements in the power supply circuit 2e will be described. The gate of the transistor M33 is connected to the node Nb2. The drain of the transistor M33 is connected to the input terminal TM1. Instead, the drain of the transistor M33 can be connected to the node Nb3. The source of the transistor M33 and the gate of the transistor M0 are connected together at a node 121. The constant current source CC32 is provided between the node 121 and the ground. The constant current source CC32 so operates that a constant current that it generates based on the input voltage Vin passes from the node 121 to the ground. The power supply circuit 2e can be modified such that the constant current source CC32 is replaced with a resistor.

When the threshold voltage of the transistor M33 is represented by the symbol $Vth_{M33}$, the gate voltage of the transistor M0 is (Vout–$Vth_{M33}$). That is, a voltage resulting from shifting the level of the output voltage Vout by the threshold voltage $Vth_{M33}$ is taken as the gate voltage of the transistor M0. The threshold voltage $Vth_{M33}$ has a negative voltage value. When the absolute value of the threshold voltage $Vth_{M33}$ is represented by $|Vth_{M33}|$, the voltage Vdd at the node Nb3 is the voltage (Vout+$|Vth_{M33}|$+$|Vth_{M0}|$). That is, when the input voltage Vin starts to be supplied (when, for example, an input voltage Vin such that Va=Vin starts to be supplied; see FIG. 4), even if the output voltage Vout equals 0 V, the gate of the transistor M0 is fed with a positive voltage ($|Vth_{M33}|$) based on the input voltage Vin; consequently a voltage ($|Vth_{M33}|$+$|Vth_{M0}|$) is applied to the node Nb3. Thus, the regulator in the power supply circuit 2e only needs to be configured such that the regulator including the amplifier circuit 21 can start up in a state where Vdd=$|Vth_{M33}|$+$|Vth_{M0}|$ (i.e., such that the output voltage Vout can rise from 0 V).

In the power supply circuit 2e, even if the output voltage Vout equals 0 V, the gate of the transistor M0 is fed with the voltage $|Vth_{M33}|$. Thus, the transistor M0 can instead be a MOSFET of an N-channel enhancement type.

Practical Example EX2_6

Practical Example EX2_6 will be described. FIG. 17 is a configuration diagram of a power supply circuit 2f according to Practical Example EX2_6. The power supply circuit 2f is one example of the power supply circuit 2 in FIG. 9. The power supply circuit 2f results from partly modifying the power supply circuit 2d in FIG. 14. Accordingly, for any feature not specifically mentioned in connection with Practical Example EX2_6, unless inconsistent, the description of that feature given in connection with the Practical Example EX2-4 can apply to Practical Example EX2_6. In the power supply circuit 2f a technology similar to that underlying Practical Example EX2_3 (FIG. 13) is applied to a regulator configured to include an amplifier circuit. The power supply circuit 2f includes, in addition to the transistor M0: a regulator, as one example of the regulator 20, composed of an amplifier circuit 21, a reference voltage generator 22, a transistor M4, and resistors R1 and R2 and a gate voltage generator, as one example of the gate voltage generator 30, composed of transistors M34 and M35 and constant current sources CC33 and CC34. The transistor M34 is a MOSFET of an N-channel enhancement type, and the transistor M35 is a MOSFET of a P-channel enhancement type. The transistor M4 can be understood to be included among the elements constituting the amplifier circuit 21.

In the power supply circuit 2f, nodes Nb2 and Nb3 correspond to the output terminal TM2 and the internal supply power terminal TM3 respectively. In the power supply circuit 2f, the interconnection among the transistors M0, M4, and M21 to M24, the resistors R1 and R2, the reference voltage generator 22, the constant current source CC21, the input terminal TM1, and the nodes Nb2 and Nb3 and the operation of these elements are the same as in the power supply circuit 2d in FIG. 14 (i.e., as described in connection with Practical Example EX2_4).

The interconnection and the operation of the other elements in the power supply circuit 2f will be described. The gate of the transistor M34 is connected to the node Nb2. The drain of the transistor M34 is connected to the input terminal TM1. Instead, the drain of the transistor M34 can be connected to the node Nb3. The source of the transistor M34 and the gate of the transistor M35 are connected together at a node 131. The constant current source CC33 is provided between the node 131 and the ground. The constant current source CC33 so operates that a constant current that it generates based on the input voltage Vin passes from the node 131 to the ground. The drain of the transistor M35 is connected to the ground. The gate of the transistor M0 is connected to a node 132. The node 132 is connected also to the source of the transistor M35. The constant current source CC34 is provided between the input terminal TM1 and the node 132. The constant current source CC34 so operates that a constant current that it generates based on the input voltage Vin passes from the input terminal TM1 to the node 132. The power supply circuit 2f can be modified such that one or both of the constant current sources CC33 and CC34 are replaced with a resistor.

The threshold voltages of the transistors M34 and M35 are represented by the symbols $Vth_{M34}$ and $Vth_{M35}$ respectively. When the input voltage Vin starts to be supplied (when, for example, an input voltage Vin such that Va=Vin starts to be supplied; see FIG. 4), in a state where the regulator is yet to start up (i.e., in a state where the output voltage Vout equals 0 V), a positive voltage that is determined by the configuration and the operation of the constant current source CC34 (i.e., a positive voltage based on the input voltage Vin) is applied to the gate of the transistor M0, and a positive voltage Vdd higher than the absolute value $|Vth_{M0}|$ of the threshold voltage of the transistor M0 is applied to the node Nb3. Thus, the regulator including the amplifier circuit 21 starts up. When the output voltage Vout becomes equal to or higher than the threshold voltage $Vth_{M34}$ of the transistor M34, a voltage resulting from shifting the level of the output voltage Vout by the voltage ($-Vth_{M34}+Vth_{M35}$) is taken as the gate voltage of the transistor M0. Thus, a voltage determined by the characteristics of the transistors M34 and M35 with reference to the output voltage Vout is taken as the supply voltage Vdd to the regulator.

Third Embodiment

Figure 18:
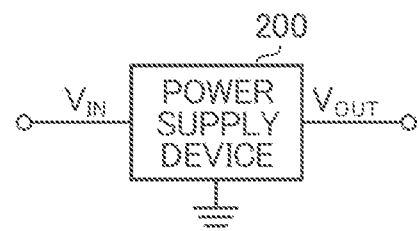
FIG. 18 is a diagram showing a power supply device according to a third embodiment of the present invention.

A third embodiment of the present invention will be described. FIG. 18 shows a power supply device 200 according to the third embodiment. The power supply device 200 receives a positive input voltage $V_{IN}$ (e.g., 5 V to 45 V) and, by bucking (stepping down) the input voltage $V_{IN}$, generates a desired positive output voltage $V_{OUT}$ (e.g., 3.3 V or 5 V). The power supply device 200 can be a power supply device that is classified as an LDO (low drop-out) regulator.

Figure 19:
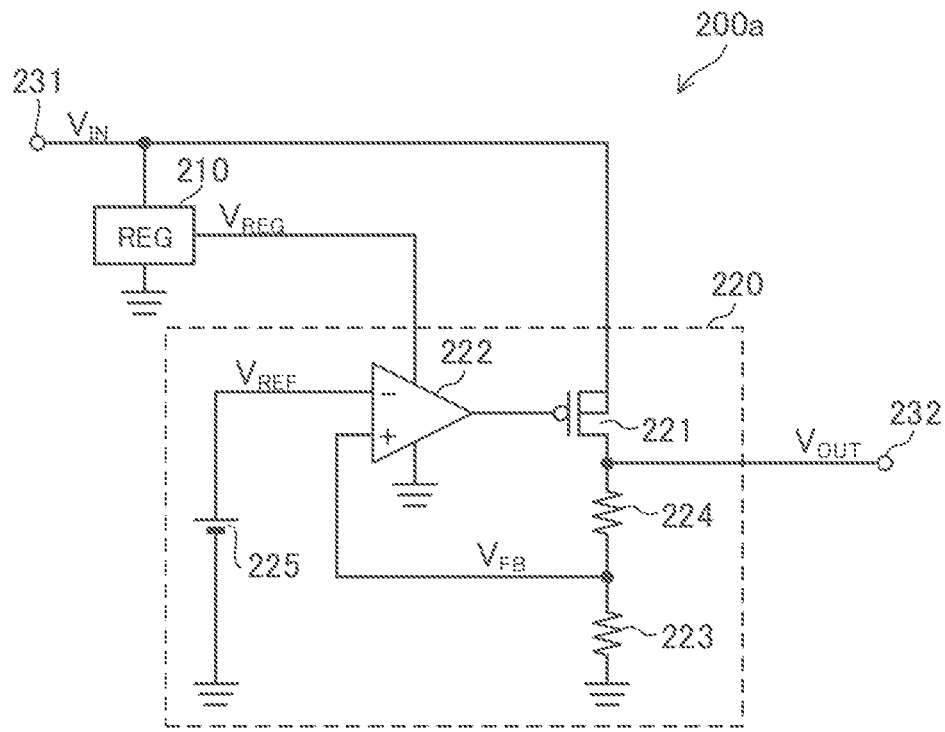
FIG. 19 is a schematic configuration diagram of the power supply device according to the third embodiment of the present invention.

FIG. 19 shows the configuration of a power supply device 200a as one example of the power supply device 200. The power supply device 200a includes a first power supply circuit 210 and a second power supply circuit 220.

The first power supply circuit 210 is an internal power supply circuit that generates an internal supply voltage $V_{REG}$ (e.g., 4 V to 5 V) by bucking the input voltage $V_{IN}$. As the first power supply circuit 210, a power supply circuit 1 (1a, 1b, 1c, 1d) according to the first embodiment or a power supply circuit 2 (2a, 2a', 2b, 2c, 2d, 2d', 2e, 2f) according to the second embodiment can be used. In that case, the input voltage Vi and the internal supply voltage $V_{REG}$ can be regarded as the previously mentioned input voltage Vin and output voltage $V_{OUT}$ respectively.

The second power supply circuit 220 is a linear power supply circuit that generates the output voltage $V_{OUT}$ by bucking the input voltage $V_{IN}$. The second power supply circuit 220 includes an output transistor 221 configured as a MOSFET of a P-channel enhancement type, an amplifier circuit 222, resistors 223 and 224, and an internal reference voltage generator 225 which generates and outputs an internal reference voltage $V_T$. The internal reference voltage $V_{REF}$ has a predetermined positive direct-current voltage value (e.g., 1 V).

The source of the output transistor 221 is connected to an input terminal 231 to which the input voltage $V_{IN}$ is applied. The drain of the output transistor 221 and one terminal of the resistor 224 are connected to an output terminal 232 to which the output voltage $V_{OUT}$ is applied. The other terminal of the resistor 224 is connected via the resistor 223 to a ground. At the node at which the resistors 223 and 224 are connected together appears a feedback voltage $V_{FB}$ that is proportional to the output voltage $V_{OUT}$. The amplifier circuit 222 is an amplifier that operates by using the internal supply voltage $V_{REG}$, and has a non-inverting input terminal, an inverting input terminal, and an output terminal. The inverting input terminal of the amplifier circuit 222 is fed with the internal reference voltage $V_{REF}$ from the internal reference voltage generator 225, and the non-inverting input terminal of the amplifier circuit 222 is fed with the feedback voltage $V_{FB}$. The output terminal of the amplifier circuit 222 is connected to the gate of the output transistor 221.

In the second power supply circuit 220, the amplifier circuit 222 controls the gate voltage of the output transistor 221 such that the feedback voltage $V_{FB}$ equals the internal reference voltage $V_{REF}$. Accordingly, the on-state resistance value of the output transistor 221 is controlled continuously such that the output voltage $V_{OUT}$ equals a voltage determined by the resistance values of the resistors 223 and 224 and the internal reference voltage $V_{REF}$.

The internal reference voltage generator 225 generates the internal reference voltage $VR_{REF}$ based on the input voltage $V_{IN}$ or the internal supply voltage $V_{REG}$. As the internal reference voltage generator 225, a power supply circuit 1 (1a, 1b, 1c, 1d) according to the first embodiment or a power supply circuit 2 (2a, 2a', 2b, 2c, 2d, 2d', 2e, 2f) according to the second embodiment can be used. In that case, the input voltage $V_{IN}$ or the internal supply voltage $V_{REG}$ can be regarded as the previously mentioned input voltage Vin, and the internal reference voltage $V_{REF}$ can be regarded as the previously mentioned output voltage Vout.

A variation in the internal reference voltage $V_{REF}$ or in the internal supply voltage $V_{REG}$ in response to a variation in input can cause a variation in the output voltage $V_{OUT}$ or an overshoot in the output voltage $V_{OUT}$. This may lead to malfunction or destruction of a load (unillustrated) that operates by being supplied with the output voltage $V_{OUT}$. Using the power supply circuit 1 or 2, which provides great performance against input variations, to generate the internal reference voltage $V_{REF}$ or the internal supply voltage $V_{REG}$ helps obtain a stable output voltage $V_{OUT}$.

Though not illustrated expressly, the second power supply circuit 220 can be configured as a switching power supply circuit.

The power supply device 200 in FIG. 18 can be a power IC formed as a semiconductor integrated circuit. In connection with the power supply device 200a in FIG. 19, an example has been dealt with where a power supply circuit 1 or 2 according to the first or second embodiment is used as the internal power supply circuit for generating the internal reference voltage $V_{REF}$ or the internal supply voltage $V_{REG}$. Instead, depending on the current capacity of the transistor M0 (see FIG. 3 etc.) in the power supply circuit 1 or 2, the power supply circuit 1 or 2 itself can be the power supply device 200. In that case, the input voltage $V_{IN}$ and the output voltage $V_{OUT}$ can be regarded as the previously mentioned input voltage Vin and output voltage Vout respectively.

Fourth Embodiment

Figure 20:
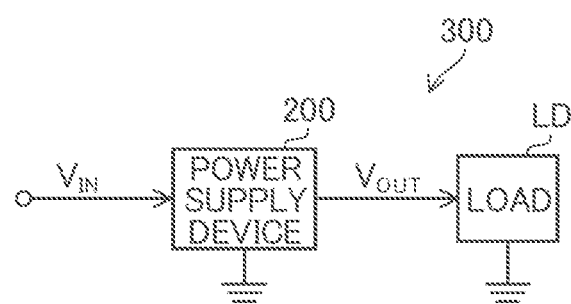
FIG. 20 is a schematic configuration diagram of an appliance according to a fourth embodiment of the present invention.

A fourth embodiment of the present invention will be described. The output voltage V ou of the power supply device 200 according to the third embodiment can be supplied to any load. As shown in FIG. 20, any appliance 300 can be configured to include a power supply device 200 and a load LD that is supplied with electric power from the power supply device 200 (i.e., a load that operates based on the output voltage $V_{OUT}$ from the power supply device 200). The appliance 300 can be an appliance that is incorporated in a vehicle such as an automobile (i.e., a vehicle-mounted appliance), or can be an industrial appliance, an office appliance, a household appliance, a portable appliance, or the like.

Figure 21:
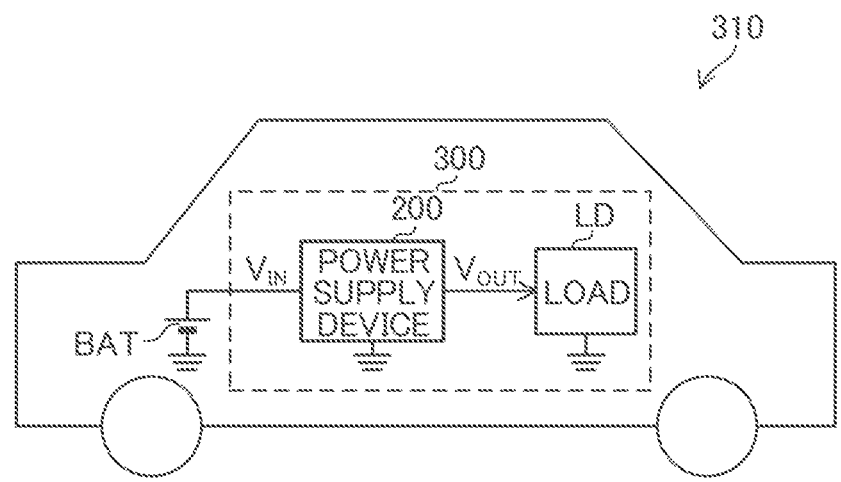
FIG. 21 is a schematic configuration diagram of a vehicle according to the fourth embodiment of the present invention.

FIG. 21 shows a schematic configuration of a vehicle 310, which is an automobile that incorporates the appliance 300. In the vehicle 310, the input voltage Vi is supplied from a battery BAT provided on the vehicle 310 to the power supply device 200. In the vehicle 310, the load LD can be any electric appliance provided on the vehicle 310. The load LD can be, for example, an ECU (electronic control unit). The ECU controls the cruising of the vehicle 310, the operation of an air conditioner, lamps, power windows, and air-bags provided on the vehicle 310, and the like. Instead, any of those air conditioner, lamps, power windows, air-bags, and the like can be the load LD.

Fifth Embodiment

A fifth embodiment of the present invention will be described. The fifth embodiment deals with technical modifications and the like applicable to the first to fourth embodiments described above.

Within the technical scope of the present invention, any of the transistors mentioned above can be configured as a transistor of any type. Specifically, for example, within the technical scope of the present invention, any MOSFET can be modified from an N-channel type to a P-channel type or from a P-channel type to an N-channel type (a type modification can require a circuit modification). For another example, within the technical scope of the present invention, some of the transistors described as MOSFETs above can be replaced with junction FETs, IGBTs (insulated-gate bipolar transistors), or bipolar transistors. Any transistor has a first electrode, a second electrode, and a control electrode. In an FET, one of the first and second electrodes corresponds to the drain, the other of them corresponds to the source, and the control electrode corresponds to the gate. In an IGBT, one of the first and second electrodes corresponds to the collector, the other of them corresponds to the emitter, and the control electrode corresponds to the gate. In a bipolar transistor that does not belong to the IGBT, one of the first and second electrodes corresponds to the collector, the other of them corresponds to the emitter, and the control electrode corresponds to the base.

In a power supply circuit 1 according to the first embodiment or a power supply circuit 2 according to the second embodiment (see FIG. 3 or 9), the transistor M0 is inserted between the input terminal TM1 for the input voltage Vin and the internal supply power terminal TM3, and thus can be called an inserted transistor. The transistor M0 has the function of clamping the voltage Vdd applied to the internal supply power terminal TM3 (as the supply voltage to the regulator) at a voltage commensurate with the output voltage Vout irrespective of the input voltage Vin, and thus can be called a clamp transistor or a power clamping element.

The embodiments of the present invention allow for many modifications made as necessary within the scope of the technical concept set forth in the appended claims. The embodiments described above are merely examples of how the present invention can be implemented, and the senses of the terms used to define the present invention and its features are not limited to those in which they are used in the description of the embodiments given above. All specific values mentioned in the above description are merely examples, and can naturally be altered to different values.

What is claimed is:

1. A power supply circuit that outputs via an output terminal an output voltage based on an input voltage applied to an input terminal, the power supply circuit comprising:
   an inserted transistor of an N-channel depletion type inserted between the input terminal and an internal supply power terminal; and
   a regulator configured to generate the output voltage by using as a supply voltage a voltage applied to the internal supply power terminal, wherein the regulator includes:
      an output transistor provided between the internal supply power terminal or the input terminal and the output terminal; and
      a controller configured to control a gate of the output transistor in accordance with the output voltage,
   wherein a gate of the inserted transistor is connected to the output terminal.

2. The power supply circuit according to claim 1, wherein
   a drain and a source of the inserted transistor are connected to the input terminal and the internal supply power terminal respectively, and
   the output terminal is pulled down.

3. A power supply circuit that outputs via an output terminal an output voltage based on an input voltage applied to an input terminal, the power supply circuit comprising:
   an inserted transistor of an N-channel type inserted between the input terminal and an internal supply power terminal;
   a regulator configured to generate the output voltage by using as a supply voltage a voltage applied to the internal supply power terminal, wherein the regulator includes:
      an output transistor provided between the internal supply power terminal or the input terminal and the output terminal; and
      a controller configured to control a gate of the output transistor in accordance with the output voltage; and
   wherein the power supply circuit further comprises a gate voltage generator connected to the output terminal and configured to feed a gate voltage commensurate with the output voltage to a gate of the inserted transistor.

4. The power supply circuit according to claim 3, wherein
   a drain and a source of the inserted transistor are connected to the input terminal and the internal supply power terminal respectively, and
   the output terminal is pulled down.

5. The power supply circuit according to claim 3, wherein the gate voltage generator is configured to generate the gate voltage of the inserted transistor by shifting a level of the output voltage.

6. The power supply circuit according to claim 3, wherein the gate voltage generator is configured, when the output voltage has a ground potential, to feed a positive voltage based on the input voltage to the gate of the inserted transistor.

7. The power supply circuit according to claim 3, wherein the inserted transistor is a transistor of an N-channel depletion type.

8. The power supply circuit according to claim 3, wherein the inserted transistor is a transistor of an N-channel enhancement type.

9. A power supply device comprising the power supply circuit according to claim 1 as an internal power supply circuit that generates an internal reference voltage or an internal supply voltage.

10. A power supply device comprising the power supply circuit according to claim 3 as an internal power supply circuit that generates an internal reference voltage or an internal supply voltage.

11. A vehicle comprising:
    the power supply device according to claim 9; and
    a load that is supplied with electric power from the power supply device.

12. A vehicle comprising:
    the power supply device according to claim 10; and
    a load that is supplied with electric power from the power supply device.

* * * * *